(12) United States Patent
Turner et al.

(10) Patent No.: US 11,949,402 B2
(45) Date of Patent: Apr. 2, 2024

(54) RESONATORS WITH DIFFERENT MEMBRANE THICKNESSES ON THE SAME DIE

(71) Applicant: MURATA MANUFACTURING CO., LTD, Kyoto (JP)

(72) Inventors: Patrick Turner, San Bruno, CA (US); Doug Jachowski, Santa Cruz, CA (US); Bryant Garcia, Burlingame, CA (US)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 189 days.

(21) Appl. No.: 17/125,960

(22) Filed: Dec. 17, 2020

(65) Prior Publication Data

US 2022/0069801 A1 Mar. 3, 2022

Related U.S. Application Data

(60) Provisional application No. 63/087,792, filed on Oct. 5, 2020, provisional application No. 63/072,595, filed on Aug. 31, 2020.

(51) Int. Cl.
*H03H 9/205* (2006.01)
*H03H 3/02* (2006.01)
(Continued)

(52) U.S. Cl.
CPC ............. *H03H 9/205* (2013.01); *H03H 3/02* (2013.01); *H03H 9/02015* (2013.01);
(Continued)

(58) Field of Classification Search
CPC ............. H03H 9/205; H03H 9/02015; H03H 9/02157; H03H 9/02228; H03H 9/588; H03H 9/605
See application file for complete search history.

(56) References Cited

U.S. PATENT DOCUMENTS 5,446,330 A 8/1995 Eda et al.
5,552,655 A 9/1996 Stokes et al.
(Continued)

FOREIGN PATENT DOCUMENTS

CN 106788318 A 5/2017
CN 110417373 A 11/2019
(Continued)

OTHER PUBLICATIONS

T. Takai, H. Iwamoto, et al., "I.H.P.Saw Technology and its Application to Microacoustic Components (Invited)." 2017 IEEE International Ultrasonics Symposium, Sept. 6-9, 2017. pp. 1-8.
(Continued)

*Primary Examiner* — Samuel S Outten
(74) *Attorney, Agent, or Firm* — ARENTFOX SCHIFF LLP

(57) ABSTRACT

An acoustic resonator is fabricated by bonding a first piezoelectric plate to a substrate and spans locations for a first and second cavity in the substrate. A top surface of the first piezoelectric plate is planarized to a first thickness. A bonding layer is formed on the first piezoelectric plate and spans the first and second cavity locations. A second piezoelectric plate is bonded to the bonding layer and spans the first and second cavity locations. A portion of the second piezoelectric plate spanning the second cavity location is etched away to form a first membrane over the first cavity location and a second membrane over the second cavity location. Interdigital transducers are formed on the first and second membranes over the first and second cavity location to form a first and second resonator on the same die.

23 Claims, 14 Drawing Sheets

(51) Int. Cl.
*H03H 9/02* (2006.01)
*H03H 9/58* (2006.01)
*H03H 9/60* (2006.01)

(52) U.S. Cl.
CPC .... *H03H 9/02157* (2013.01); *H03H 9/02228* (2013.01); *H03H 9/588* (2013.01); *H03H 9/605* (2013.01)

(56) References Cited

U.S. PATENT DOCUMENTS

| | | |
|---|---|---|
| 5,726,610 A | 3/1998 | Allen et al. |
| 5,853,601 A | 12/1998 | Krishaswamy et al. |
| 6,377,140 B1 | 4/2002 | Ehara et al. |
| 6,516,503 B1 | 2/2003 | Ikada et al. |
| 6,540,827 B1 | 4/2003 | Levy et al. |
| 6,707,229 B1 | 3/2004 | Martin |
| 6,710,514 B2 | 3/2004 | Ikada et al. |
| 7,042,132 B2 | 5/2006 | Bauer et al. |
| 7,345,400 B2 | 3/2008 | Nakao et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,728,483 B2 | 6/2010 | Tanaka |
| 7,868,519 B2 | 1/2011 | Umeda |
| 7,941,103 B2 | 5/2011 | Iwamoto et al. |
| 8,278,802 B1 | 10/2012 | Lee et al. |
| 8,294,330 B1 | 10/2012 | Abbott et al. |
| 8,344,815 B2 | 1/2013 | Yamanaka |
| 8,816,567 B2 | 8/2014 | Zuo et al. |
| 8,829,766 B2 | 9/2014 | Milyutin et al. |
| 8,932,686 B2 | 1/2015 | Hayakawa et al. |
| 9,093,979 B2 | 7/2015 | Wang |
| 9,112,134 B2 | 8/2015 | Takahashi |
| 9,130,145 B2 | 9/2015 | Martin et al. |
| 9,219,466 B2 | 12/2015 | Meltaus et al. |
| 9,240,768 B2 | 1/2016 | Nishihara et al. |
| 9,276,557 B1 | 3/2016 | Nordquist et al. |
| 9,369,105 B1 | 6/2016 | Li |
| 9,425,765 B2 | 8/2016 | Rinaldi |
| 9,525,398 B1 | 12/2016 | Olsson |
| 9,564,873 B2 | 2/2017 | Kadota |
| 9,640,750 B2 | 5/2017 | Nakanishi et al. |
| 9,748,923 B2 | 8/2017 | Kando et al. |
| 9,762,202 B2 | 9/2017 | Thalmayr et al. |
| 9,780,759 B2 | 10/2017 | Kimura et al. |
| 9,837,984 B2 | 12/2017 | Khlat et al. |
| 10,079,414 B2 | 9/2018 | Guyette et al. |
| 10,187,039 B2 | 1/2019 | Komatsu et al. |
| 10,200,013 B2 | 2/2019 | Bower et al. |
| 10,211,806 B2 | 2/2019 | Bhattacharjee |
| 10,284,176 B1 | 5/2019 | Solal |
| 10,389,391 B2 | 8/2019 | Ito et al. |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,644,674 B2 | 5/2020 | Takamine |
| 10,756,697 B2 | 8/2020 | Plesski et al. |
| 10,790,802 B2 | 9/2020 | Yantchev et al. |
| 10,797,675 B2 | 10/2020 | Plesski |
| 10,826,462 B2 | 11/2020 | Plesski et al. |
| 10,868,512 B2 | 12/2020 | Garcia et al. |
| 10,917,070 B2 | 2/2021 | Plesski et al. |
| 11,146,232 B2 | 10/2021 | Yandrapalli et al. |
| 11,201,601 B2 | 12/2021 | Yantchev et al. |
| 11,418,167 B2 | 8/2022 | Garcia |
| 2002/0079986 A1 | 6/2002 | Ruby et al. |
| 2002/0158714 A1 | 10/2002 | Kaitila et al. |
| 2002/0189062 A1 | 12/2002 | Lin et al. |
| 2003/0080831 A1 | 5/2003 | Naumenko et al. |
| 2003/0199105 A1 | 10/2003 | Kub et al. |
| 2004/0041496 A1 | 3/2004 | Imai et al. |
| 2004/0100164 A1 | 5/2004 | Murata |
| 2004/0261250 A1 | 12/2004 | Kadota et al. |
| 2005/0185026 A1 | 8/2005 | Noguchi et al. |
| 2005/0218488 A1 | 10/2005 | Matsuo |
| 2005/0264136 A1 | 12/2005 | Tsutsumi et al. |
| 2006/0179642 A1 | 8/2006 | Kawamura |
| 2007/0115079 A1 | 5/2007 | Kubo et al. |
| 2007/0182510 A1 | 8/2007 | Park |
| 2007/0188047 A1 | 8/2007 | Tanaka |
| 2007/0194863 A1 | 8/2007 | Shibata et al. |
| 2007/0267942 A1 | 11/2007 | Matsumoto et al. |
| 2008/0246559 A1 | 10/2008 | Ayazi |
| 2008/0297280 A1 | 12/2008 | Thalhammer et al. |
| 2009/0315640 A1 | 12/2009 | Umeda et al. |
| 2010/0019866 A1 | 1/2010 | Hara et al. |
| 2010/0064492 A1 | 3/2010 | Tanaka |
| 2010/0102669 A1 | 4/2010 | Yamanaka |
| 2010/0123367 A1 | 5/2010 | Tai et al. |
| 2010/0301703 A1 | 12/2010 | Chen et al. |
| 2011/0018389 A1 | 1/2011 | Fukano et al. |
| 2011/0018654 A1 | 1/2011 | Bradley et al. |
| 2011/0102107 A1 | 5/2011 | Onzuka |
| 2011/0109196 A1 | 5/2011 | Goto |
| 2011/0199163 A1 | 8/2011 | Yamanaka |
| 2011/0278993 A1 | 11/2011 | Iwamoto |
| 2012/0286900 A1 | 11/2012 | Kadota et al. |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0321100 A1 | 12/2013 | Wang |
| 2014/0009032 A1 | 1/2014 | Takahashi et al. |
| 2014/0009247 A1 | 1/2014 | Moriya |
| 2014/0113571 A1 | 4/2014 | Fujiwara et al. |
| 2014/0130319 A1 | 5/2014 | Iwamoto |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2015/0014795 A1 | 1/2015 | Franosch et al. |
| 2015/0042417 A1 | 2/2015 | Onodera et al. |
| 2015/0319537 A1 | 11/2015 | Perois et al. |
| 2015/0333730 A1 | 11/2015 | Meltaus |
| 2016/0028367 A1 | 1/2016 | Shealy |
| 2016/0149554 A1 | 5/2016 | Nakagawa |
| 2016/0182009 A1 | 6/2016 | Bhattacharjee |
| 2016/0285430 A1 | 9/2016 | Kikuchi et al. |
| 2017/0063332 A1 | 3/2017 | Gilbert et al. |
| 2017/0104470 A1 | 4/2017 | Koelle et al. |
| 2017/0179928 A1 | 6/2017 | Raihn et al. |
| 2017/0187352 A1 | 6/2017 | Omura |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0290160 A1 | 10/2017 | Takano et al. |
| 2017/0370791 A1 | 12/2017 | Nakamura et al. |
| 2018/0005950 A1 | 1/2018 | Watanabe |
| 2018/0013405 A1 | 1/2018 | Takata |
| 2018/0026603 A1 | 1/2018 | Iwamoto |
| 2018/0033952 A1 | 2/2018 | Yamamoto |
| 2018/0062615 A1 | 3/2018 | Kato et al. |
| 2018/0062617 A1 | 3/2018 | Yun et al. |
| 2018/0123016 A1 | 5/2018 | Gong et al. |
| 2018/0152169 A1 | 5/2018 | Goto et al. |
| 2018/0191322 A1 | 7/2018 | Chang et al. |
| 2018/0316333 A1 | 11/2018 | Nakamura et al. |
| 2019/0007022 A1 | 1/2019 | Goto et al. |
| 2019/0068164 A1 | 2/2019 | Houlden et al. |
| 2019/0123721 A1 | 4/2019 | Takamine |
| 2019/0131953 A1 | 5/2019 | Gong |
| 2019/0181825 A1 | 6/2019 | Schmalzl et al. |
| 2019/0181833 A1 | 6/2019 | Nosaka |
| 2019/0207583 A1 | 7/2019 | Miura et al. |
| 2019/0245518 A1 | 8/2019 | Ito |
| 2019/0273480 A1 | 9/2019 | Lin |
| 2019/0348966 A1 | 11/2019 | Campanella-Pineda |
| 2019/0386635 A1 | 12/2019 | Plesski et al. |
| 2019/0386638 A1 | 12/2019 | Kimura et al. |
| 2020/0036357 A1 | 1/2020 | Mimura |
| 2020/0228087 A1 | 7/2020 | Michigami et al. |
| 2020/0235719 A1 | 7/2020 | Yantchev et al. |

(56) References Cited

U.S. PATENT DOCUMENTS

| | | | |
|---|---|---|---|
| 2020/0244247 | A1 | 7/2020 | Maeda |
| 2020/0304091 | A1 | 9/2020 | Yantchev |
| 2020/0321939 | A1 | 10/2020 | Turner et al. |
| 2020/0328728 | A1 | 10/2020 | Nakagawa et al. |
| 2021/0273631 | A1 | 9/2021 | Jachowski et al. |
| 2021/0313951 | A1 | 10/2021 | Yandrapalli et al. |
| 2022/0103160 | A1 | 3/2022 | Jachowski et al. |
| 2022/0116015 | A1 | 4/2022 | Garcia et al. |
| 2022/0123720 | A1 | 4/2022 | Garcia et al. |
| 2022/0123723 | A1 | 4/2022 | Garcia et al. |
| 2022/0149808 | A1 | 5/2022 | Dyer et al. |
| 2022/0149814 | A1 | 5/2022 | Garcia et al. |
| 2022/0407494 | A1* | 12/2022 | Peng ................. H03H 9/02228 |

FOREIGN PATENT DOCUMENTS

| | | |
|---|---|---|
| CN | 210431367 U | 4/2020 |
| JP | H10209804 A | 8/1998 |
| JP | 2001244785 A | 9/2001 |
| JP | 2002300003 A | 10/2002 |
| JP | 2003078389 A | 3/2003 |
| JP | 2004096677 A | 3/2004 |
| JP | 2004129222 A | 4/2004 |
| JP | 2004304622 A | 10/2004 |
| JP | 2006173557 A | 6/2006 |
| JP | 2007251910 A | 9/2007 |
| JP | 2010062816 A | 3/2010 |
| JP | 2010103803 A | 5/2010 |
| JP | 2010233210 A | 10/2010 |
| JP | 2013528996 A | 7/2013 |
| JP | 2013214954 A | 10/2013 |
| JP | 2015054986 A | 3/2015 |
| JP | 2016001923 A | 1/2016 |
| JP | 2018093487 A | 6/2018 |
| JP | 2018166259 A | 10/2018 |
| JP | 2018207144 A | 12/2018 |
| JP | 2019186655 A | 10/2019 |
| JP | 2020113939 A | 7/2020 |
| WO | 2010047114 A1 | 4/2010 |
| WO | 2015098694 A1 | 7/2015 |
| WO | 2016017104 | 2/2016 |
| WO | 2016052129 A1 | 4/2016 |
| WO | 2016147687 A1 | 9/2016 |
| WO | 2018003273 A1 | 1/2018 |
| WO | 2018163860 A1 | 9/2018 |
| WO | 2019138810 A1 | 7/2019 |
| WO | 2020092414 A2 | 5/2020 |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHZ Lithium Niobate MEMS Resonators With High Fom of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A.. (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi:10.1002/ecja.4410690406.

Naumenko et al., "Optimal orientations of Lithium Niobate for resonator SAW filters", 2003 IEEE Ultrasonics Symposium—pp. 2110-2113. (Year: 2003).

Webster Dictionary Meaning of "diaphragm" Merriam Webster since 1828.

Safari et al."Piezoelectric for Transducer Applications"published by Elsevier Science Ltd., pp. 4 (Year: 2000).

Moussa et al.Review on Triggered Liposomal Drug Delivery with a Focus on Ultrasound2015, Bentham Science Publishers, pp. 16 (Year 2005).

Acoustic Properties of SolidsONDA Corporation592 Weddell Drive, Sunnyvale, CA 94089, Apr. 11, 2003, pp. 5 (Year 2003).

Bahreynl, B.Fabrication and Design of Resonant MicrodevicesAndrew William, Inc. 2018, NY (Year 2008).

Material Properties of Tibtech Innovations,@ 2018 TIBTECH Innovations (Year 2018).

Buchanan "Ceramit Materials for Electronics" 3rd Edition, first published in 2004 by Marcel Dekker, Inc. pp. 496 (Year 2004). 00 Jan. 2004.

Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 pp. 675 (Year 2015) 00 Jan. 2015.

Zou, Jie "High-Performance Aluminum Nitride Lamb Wave Resonators for RF Front-End Technology" University of California, Berkeley, Summer 2015, pp. 63 (Year 2015) 00 Jan. 2015.

Santosh, G. , Surface acoustic wave devices on silicon using patterned and thin film ZnO, Ph.D. thesis, Feb. 2016, Indian Institute of technology Guwahati, Assam, India Feb. 2016.

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

USPTO/ISA, International Search Report and Written Opinion for PCT Application No. PCT/US2020/45654 dated Oct. 29, 2020. 2020.

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

Rodriguez-Madrid et al., "Super-High-Frequency SAW Resonators on AIN/Diamond", IEEE Electron Device Letters, vol. 33, No. 4, Apr. 2012, pp. 495-497. Year: 2012) 2012.

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.

Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.

Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

USPTO/ISA, International Search Report and Written Opinion for PCT Application No. PCT/US2021/048505 dated Dec. 1, 2021, 11 total pages.

USPTO/ISA, International Search Report and Written Opinion for PCT Application No. PCT/US2021/028424 dated Jul. 27, 2021, 9 total pages.

Chen et al., "Development and Application of SAW Filter," Micromachines, Apr. 20, 2022, vol. 13, No. 656, pp. 1-15.

Hermann et al., "Properties of shear-horizontal surface acoustic waves in different layered quartz-SiO2 structures," Ultrasonics, 1999, vol. 37, pp. 335-341.

(56) References Cited

OTHER PUBLICATIONS

International Search Report and Written Opinion in PCT/US2022/081068, dated Apr. 18, 2023, 17 pages.

Lam et al., "A Review of Lame and Lamb Mode Crystal Resonators for Timing Applications and Prospects of Lame and Lamb Mode Piezo MEMS Resonators for Filtering Applications," 2018 International Symposium on Acoustic Wave Devices for Future Mobile Communication Systems, Mar. 6-7, 2018, 12 pages.

Kadota et al., "Ultra Wideband Ladder Filter Using SH0 Plate Wave in Thin LiNbO3 Plate and Its Application to Tunable Filter," IEEE Transactions on Ultrasonics, Ferroelectrics, and Frequency Control, 2015, vol. 62, No. 5, pp. 939-946.

Gorisse et al., "Lateral Field Excitation of membrane-based Aluminum Nitride resonators", 2011 Joint Conference of the IEEE International Frequency Control and the European Frequency and Time Forum (FCS) Proceedings, 5 pages.

Pang et al. "Self-Aligned Lateral Field Excitation Film Acoustic Resonator with Very Large Electromechanical Coupling", 2004 IEEE International Ultrasonics, Ferroelectrics and Frequency Control Joint 50th Anniversary Conference, pp. 558-561.

Xue et al. "High Q Lateral-Field-Excited Bulk Resonator Based on Single-Crystal LiTaO3 for 5G Wireless Communication", Journal of Electron devices society, vol. 9, Mar. 26, 2021, pp. 353-358.

Yandrapalli et al., "Toward Band n78 Shear Bulk Acoustic Resonators Using Crystalline Y-Cut Lithium Niobate Films with Spurious Suppression", Journal of Microelectromechanical Systems, vol. 32, No. 4, Aug. 2023, pp. 327-334.

\* cited by examiner

RESONATORS WITH DIFFERENT MEMBRANE THICKNESSES ON THE SAME DIE

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

RELATED APPLICATION INFORMATION

The patent claims priority to the following copending U.S. provisional patent applications: application 63/087,792, filed Oct. 5, 2020, entitled MULTIPLE LN THICKNESS BONDED WAFERS FOR WIDEBAND XBAR FILTER; and application 63/072,595, filed Aug. 31, 2020, entitled RESONATORS WITH DIFFERENT MEMBRANE THICKNESSES ON THE SAME DIE.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

Figure 1:
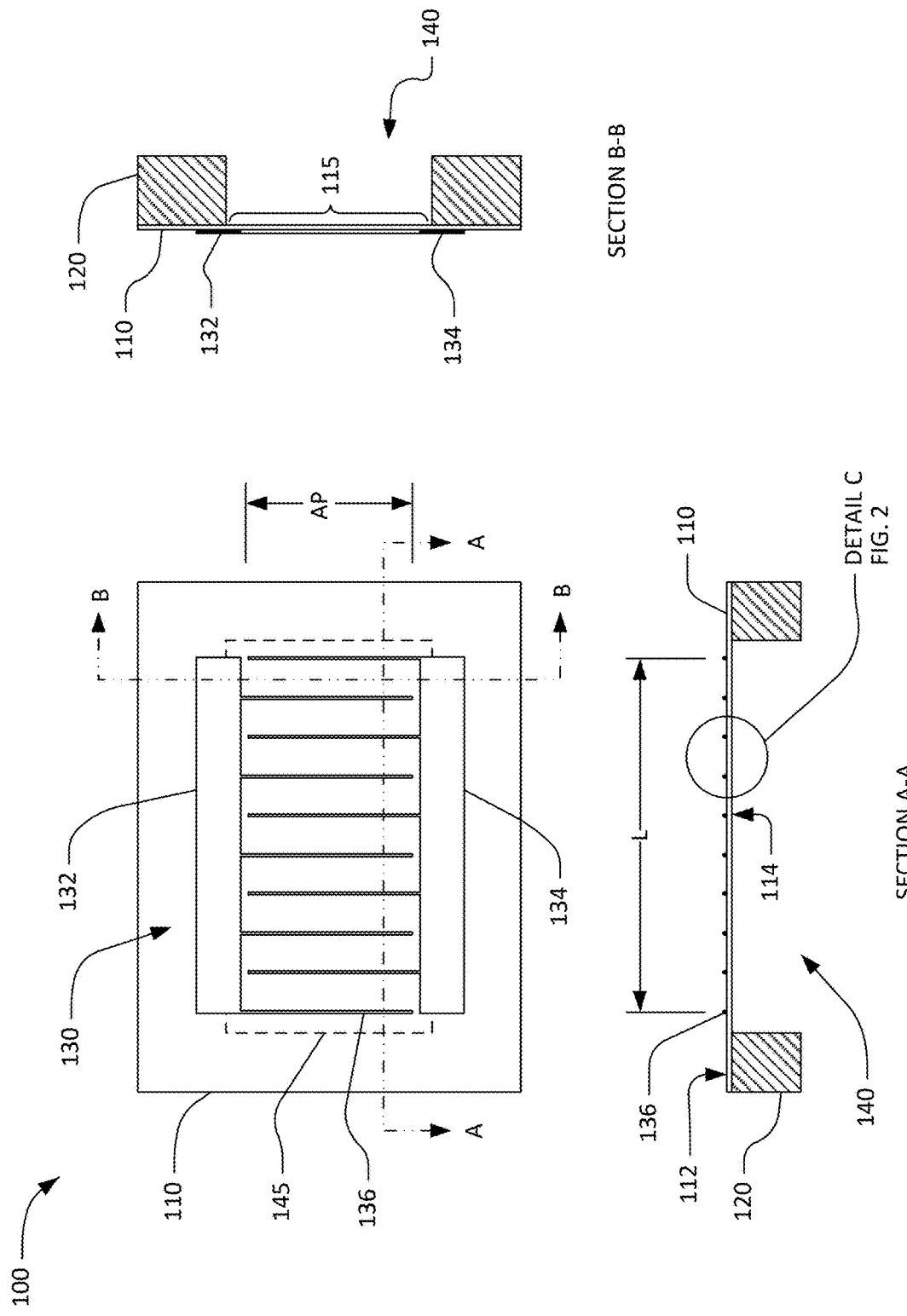
FIG. 1 includes a schematic plan view and two schematic cross-sectional views of a transversely-excited film bulk acoustic resonator (XBAR).

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

The Shear-Mode Film Bulk Acoustic Resonator (XBAR) is a new resonator structure for use in microwave filters. The XBAR is described in U.S. Pat. No. 10,491,291, titled TRANSVERSELY EXCITED FILM BULK ACOUSTIC RESONATOR, which is incorporated herein by reference in its entirety. An XBAR resonator comprises an interdigital transducer (IDT) formed on a thin floating layer, or diaphragm, of a piezoelectric material. A microwave signal applied to the IDT excites a shear primary acoustic wave in the piezoelectric diaphragm, such that the acoustic energy flows substantially normal to the surfaces of the layer, which is orthogonal or transverse to the direction of the electric field generated by the IDT. XBAR resonators provide very high electromechanical coupling and high frequency capability.

An RF filter may incorporate multiple XBAR devices connected as a conventional ladder filter circuit. A ladder filter circuit includes one or more series resonator connected in series between an input and an output of the filter and one or more shunt resonators, each connected between ground and one of the input, the output, or a node between two series resonators. Each resonator has a resonance frequency where the admittance of the resonator approaches that of a short circuit, and an anti-resonance frequency where the admittance of the resonator approaches that of an open circuit. In a typical ladder band-pass filter circuit, the resonance frequencies of shunt resonators are located below a lower edge of a passband of the filter and the antiresonance frequencies of series resonators are located above an upper edge of the passband.

The dominant parameter that determines the resonance frequency of an XBAR is the thickness of the piezoelectric membrane or diaphragm suspended over a cavity. Resonance frequency also depends, to a lesser extent, on the pitch and width, or mark, of the IDT fingers. Many filter applications require resonators with a range of resonance and/or anti-resonance frequencies beyond the range that can be achieved by varying the pitch of the IDTs. U.S. Pat. No. 10,491,291 describes the use of a dielectric frequency setting layer deposited between and/or over the fingers of the fingers of the IDTs of shunt resonators to lower the resonance frequencies of the shunt resonators with respect to the resonance frequencies of the series resonators.

The dielectric frequency setting layer thickness required for wide-bandwidth filters facilitates excitation of spurious modes that may be located within the pass-band of the filter. Described herein are devices having and methods of forming two (or more) different XBAR piezoelectric membrane (e.g., diaphragm) thicknesses on the same die to tune the membranes, rather than by using a dielectric frequency setting layer on the membranes.

The following describes improved XBAR resonators formed on the same die with different membrane thicknesses. The resonators may be composite piezoelectric wafers for wideband filters that use a thin Al2O3 bonding layer to form the different membrane thicknesses. The composite piezoelectric wafer allows two-chip comparable performance of different thickness resonators to be accomplished on a single XBAR die by using two thin piezoelectric layers bonded with the thin bonding layer.

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate 110 is a thin single-crystal layer of a piezoelectric material such as lithium niobate, lithium tantalate, lanthanum gallium silicate, gallium nitride, or aluminum nitride. In some cases, plate 110 is two layers of piezoelectric single-crystal material bonded by a bonding layer. In other cases, plate 110 is a lower layer of piezoelectric single-crystal material and an upper bonding layer. The piezoelectric plate is cut such that the orientation of the X, Y, and Z crystalline axes with respect to the front and back surfaces is known and consistent. In the examples presented, the piezoelectric plates may be Z-cut, which is to say the Z axis is normal to the surfaces. However, XBARs may be fabricated on piezoelectric plates with other crystallographic orientations.

The back surface 114 of the piezoelectric plate 110 is attached to a substrate 120 that provides mechanical support to the piezoelectric plate 110. The substrate 120 may be, for example, silicon, sapphire, quartz, or some other material. The substrate may have layers of silicon thermal oxide (TOX) and crystalline silicon. The back surface 114 of the piezoelectric plate 110 may be bonded to the substrate 120 using a wafer bonding process, or grown on the substrate 120, or attached to the substrate in some other manner. The piezoelectric plate may be attached directly to the substrate or may be attached to the substrate via one or more intermediate material layers.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the excited primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

A cavity 140 is formed in the substrate 120 such that a portion 115 of the piezoelectric plate 110 containing the IDT 130 is suspended over the cavity 140 without contacting the substrate 120. "Cavity" has its conventional meaning of "an empty space within a solid body." The cavity 140 may be a hole completely through the substrate 120 (as shown in Section A-A and Section B-B) or a recess in the substrate 120 (as shown subsequently in FIG. 3A). The cavity 140 may be formed, for example, by selective etching of the substrate 120 before or after the piezoelectric plate 110 and the substrate 120 are attached. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

The portion 115 of the piezoelectric plate suspended over the cavity 140 will be referred to herein as the "diaphragm" (for lack of a better term) due to its physical resemblance to the diaphragm of a microphone. The diaphragm may be continuously and seamlessly connected to the rest of the piezoelectric plate 110 around all, or nearly all, of perimeter 145 of the cavity 140. In this context, "contiguous" means "continuously connected without any intervening item".

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
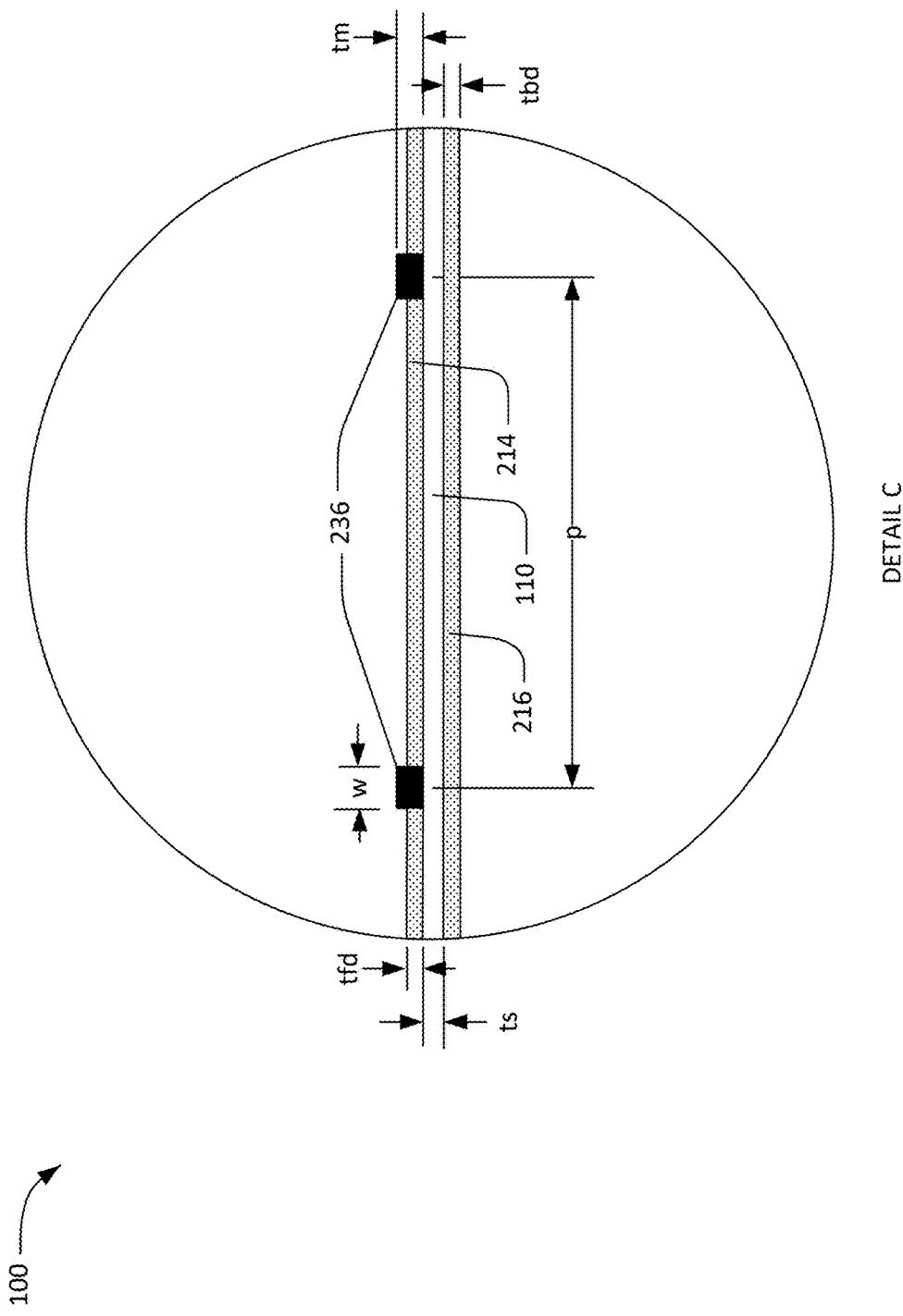
FIG. 2 is an expanded schematic cross-sectional view of a portion of the XBAR of FIG. 1.

FIG. 2 shows a detailed schematic cross-sectional view of the XBAR 100 of FIG. 1. The cross-sectional view may be a portion of the XBAR 100 that includes fingers of the IDT. The piezoelectric plate 110 is a single-crystal layer of piezoelectrical material having a thickness ts. The ts may be, for example, 100 nm to 1500 nm. When used in filters for LTE™ bands from 3.4 GHZ to 6 GHz (e.g. bands n77, n79), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 236. Although not shown in FIG. 2, the front side dielectric layer 214 may also be deposited over the IDT fingers 236. A back-side dielectric layer 216 may optionally be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. tfd and tbd may be, for example, 0 to 500 nm. tfd and tbd are typically less than the thickness ts of the piezoelectric plate. tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The front side dielectric layer 214 may be formed over the IDTs of some (e.g., selected ones) of the XBAR devices in a filter. The front side dielectric 214 may be formed between and cover the IDT finger of some XBAR devices but not be formed on other XBAR devices. For example, a front side frequency-setting dielectric layer may be formed over the IDTs of shunt resonators to lower the resonance frequencies of the shunt resonators with respect to the resonance frequencies of series resonators, which have thinner or no front side dielectric. Some filters may include two or more different thicknesses of front side dielectric over various resonators. The resonance frequency of the resonators can be set thus "tuning" the resonator, at least in part, by selecting a thicknesses of the front side dielectric.

Further, a passivation layer may be formed over the entire surface of the XBAR device 100 except for contact pads where electric connections are made to circuitry external to the XBAR device. The passivation layer is a thin dielectric layer intended to seal and protect the surfaces of the XBAR device while the XBAR device is incorporated into a package. The front side dielectric layer and/or the passivation layer may be, $SiO_2$, $Si_3N_4$, $Al_2O_3$, some other dielectric material, or a combination of these materials.

The thickness of the passivation layer may be selected to protect the piezoelectric plate and the metal electrodes from water and chemical corrosion, particularly for power durability purposes. It may range from 10 to 100 nm. The passivation material may consist of multiple oxide and/or nitride coatings such as SiO2 and Si3N4 material.

The IDT fingers 236 may be one or more layers of aluminum or a substantially aluminum alloy, copper or a substantially copper alloy, beryllium, tungsten, molybdenum, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric slab 212. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3A:
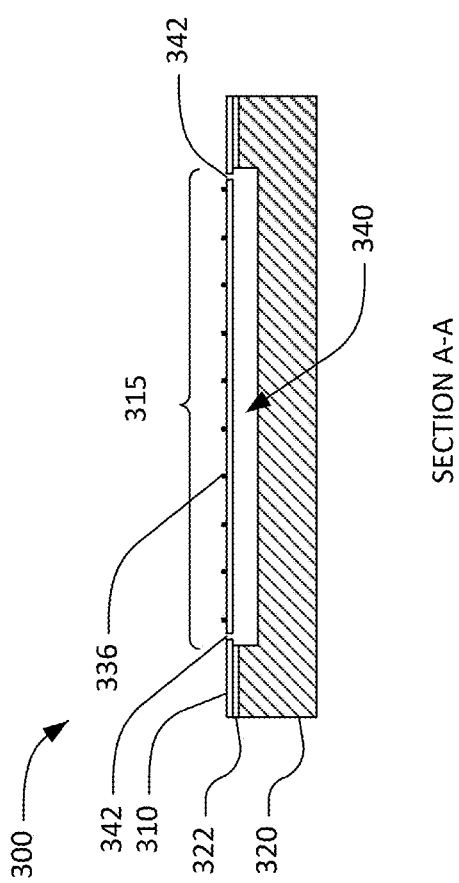
FIG. 3A is an alternative schematic cross-sectional view of the XBAR of FIG. 1.

FIG. 3A is an alternative cross-sectional view of XBAR device 300 along the section plane A-A defined in FIG. 1. In FIG. 3A, a piezoelectric plate 310 is attached to a substrate 320. A portion of the piezoelectric plate 310 forms a diaphragm 315 spanning a cavity 340 in the substrate. The cavity 340, does not fully penetrate the substrate 320, and is formed in the substrate under the portion of the piezoelectric plate 310 containing the IDT of an XBAR. Fingers, such as finger 336, of an IDT are disposed on the diaphragm 315. The cavity 340 may be formed, for example, by etching the substrate 320 before attaching the piezoelectric plate 310. Alternatively, the cavity 340 may be formed by etching the substrate 320 with a selective etchant that reaches the substrate through one or more openings 342 provided in the piezoelectric plate 310. The diaphragm 315 may be contiguous with the rest of the piezoelectric plate 310 around a large portion of a perimeter 345 of the cavity 340. For example, the diaphragm 315 may be contiguous with the rest of the piezoelectric plate 310 around at least 50% of the perimeter of the cavity 340.

One or more intermediate material layers 322 may be attached between plate 310 and substrate 320. An intermediary layer may be an etch stop layer, a sealing layer, an adhesive layer or layer of other material that is attached or bonded to plate 310 and substrate 320. In other embodiments, the piezoelectric plate 310 is attached directly to the substrate 320 and an intermediary layer does not exist.

While the cavity 340 is shown in cross-section, it should be understood that the lateral extent of the cavity is a continuous closed band area of substrate 320 that surrounds and defines the size of the cavity 340 in the direction normal to the plane of the drawing. The lateral (i.e. left-right as shown in the figure) extent of the cavity 340 is defined by the lateral edges substrate 320. The vertical (i.e. down from plate 310 as shown in the figure) extent or depth of the cavity 340 into substrate 320. In this case, the cavity 340 has a side cross-section rectangular, or nearly rectangular, cross section.

The XBAR 300 shown in FIG. 3A will be referred to herein as a "front-side etch" configuration since the cavity 340 is etched from the front side of the substrate 320 (before or after attaching the piezoelectric plate 310). The XBAR 100 of FIG. 1 will be referred to herein as a "back-side etch" configuration since the cavity 140 is etched from the back side of the substrate 120 after attaching the piezoelectric plate 110. The XBAR 300 shows one or more openings 342 in the piezoelectric plate 310 at the left and right sides of the cavity 340. However, in some cases openings 342 in the piezoelectric plate 310 are only at the left or right side of the cavity 340.

Figure 3B:
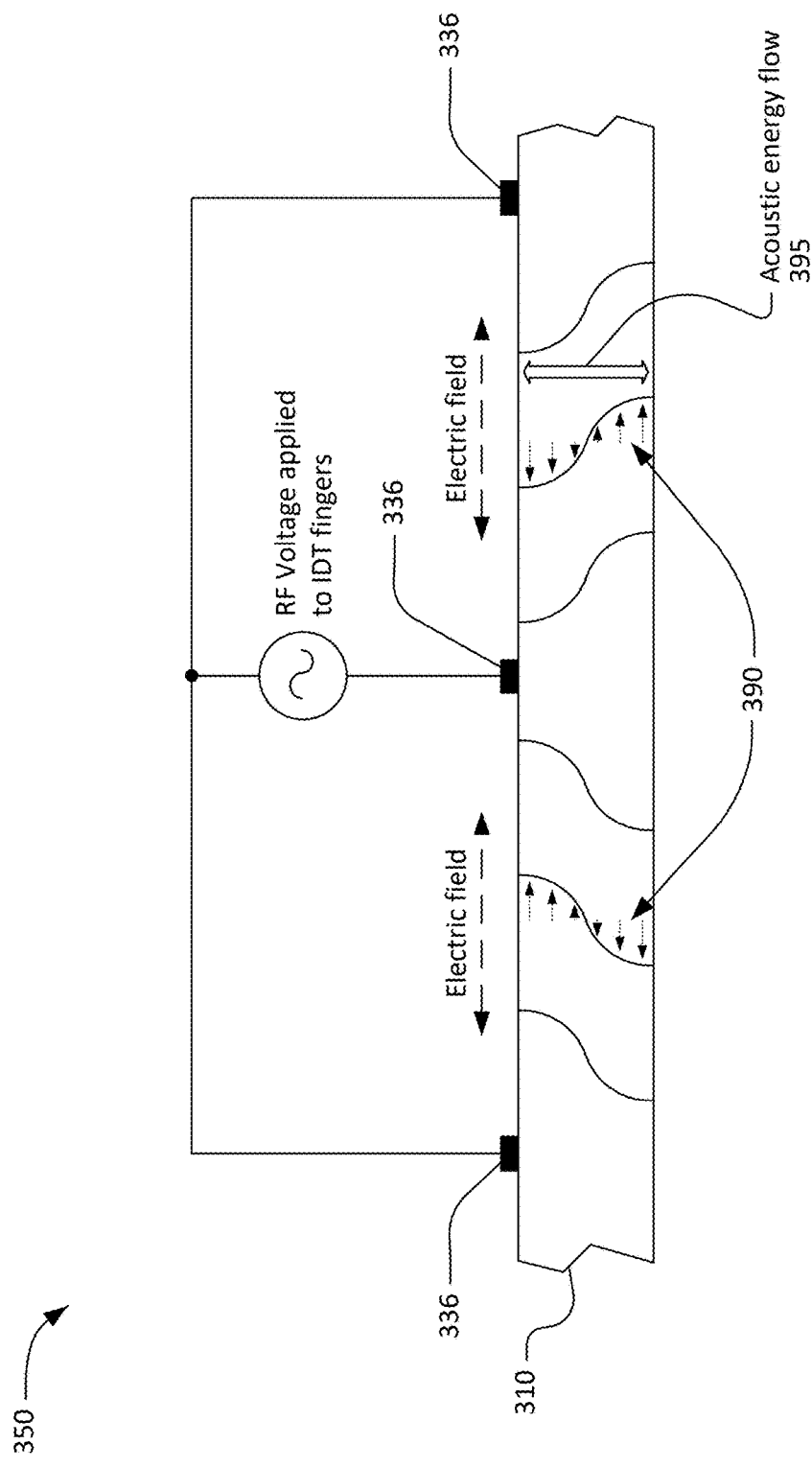
FIG. 3B is a graphical illustration of the primary acoustic mode of interest in an XBAR.

FIG. 3B is a graphical illustration of the primary acoustic mode of interest in an XBAR. FIG. 3B shows a small portion of an XBAR 350 including a piezoelectric plate 310 and three interleaved IDT fingers 336. XBAR 350 may be part of any XBAR herein. An RF voltage is applied to the interleaved fingers 336. This voltage creates a time-varying electric field between the fingers. The direction of the electric field is primarily lateral, or parallel to the surface of the piezoelectric plate 310, as indicated by the arrows labeled "electric field". Due to the high dielectric constant of the piezoelectric plate, the electric field is highly concentrated in the plate relative to the air. The lateral electric field introduces shear deformation, and thus strongly excites a primary shear-mode acoustic mode, in the piezoelectric plate 310. In this context, "shear deformation" is defined as deformation in which parallel planes in a material remain parallel and maintain a constant distance while translating relative to each other. A "shear acoustic mode" is defined as an acoustic vibration mode in a medium that results in shear deformation of the medium. The shear deformations in the XBAR 350 are represented by the curves 390, with the adjacent small arrows providing a schematic indication of the direction and magnitude of atomic motion. The degree of atomic motion, as well as the thickness of the piezoelectric plate 310, have been greatly exaggerated for ease of visualization. While the atomic motions are predominantly lateral (i.e. horizontal as shown in FIG. 3A), the direction of acoustic energy flow of the excited primary shear acoustic mode is substantially orthogonal to the front and back surface of the piezoelectric plate, as indicated by the arrow 395.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. High piezoelectric coupling enables the design and implementation of microwave and millimeter-wave filters with appreciable bandwidth.

Figure 4A:
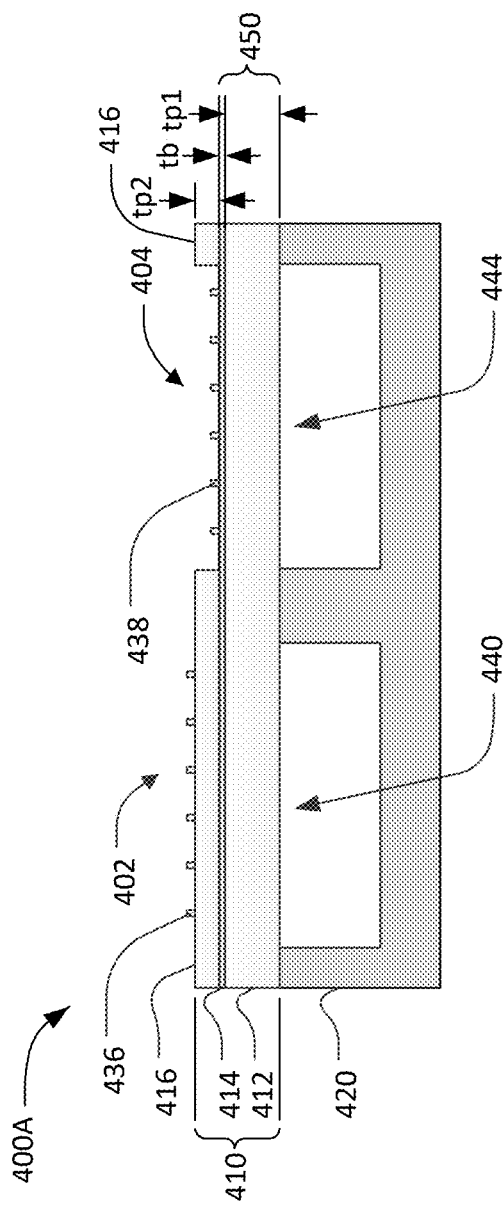
FIG. 4A is an alternative schematic cross-sectional view of improved XBAR resonators formed on the same die with different membrane thicknesses.

FIG. 4A is a schematic cross-sectional view of improved XBAR resonators 402 and 404 formed on the same die 400A with different membrane thicknesses. Die 400A may be or may be part of a filter device having resonator 402 as lower frequency shunt resonator and resonator 404 as a higher frequency series resonator with respect to the input and output of the filter device. In any case, resonator 402 or 404 can be any of the resonators described herein. A "die" may be a semiconductor chip or integrated circuit (IC) chip that is diced from other chips such as of a wafer. It may be a monolithic integrated circuit (also referred to as an IC, a chip, or a microchip) that has a set of electronic circuits on one small flat piece (or "chip") of semiconductor material that is normally silicon.

Die 400A has substrate 420 having a first cavity 440 and a second cavity 444. A first piezoelectric membrane (e.g., diaphragm) 410 spans the first cavity 440; and a second piezoelectric membrane 450 spans the second cavity 444. The first piezoelectric membrane 410 includes piezoelectric plate 412, bonding layer 414 and piezoelectric plate 416. The second piezoelectric membrane 450 includes piezoelectric plate 412 and bonding layer 414 but not second piezoelectric plate 416. Membrane 410 may be composite (at least two material) layers that are plate 416 chemically or molecularly bonded to layer 414 that is chemically or molecularly bonded to plate 412. Membrane 450 may be composite layers that are layer 414 that is chemically or molecularly bonded to plate 412, and plate 416 may have been patterned and etched away from the top of resonator 404 using bonding layer 414 as an etch stop.

The piezoelectric plate 412 has a thickness tp1 which may be between 300 and 600 nm. The bonding layer 414 has a thickness tb which may be between 5 and 50 nm. And piezoelectric plate 416 has a thickness tp2 which may be between 50 and 200 nm. In some cases, tp1 is 451, 458 or 465 nm; and tb is 10, 20 or 30 nm, respectively. Tp2 can be 120 nm and tm can be 650 nm. In some cases, tp1 and tp2 are the same and can be 197.5 nm. In other cases, they are different and can be tp1=465 nm and tp2=120 nm. Tp1 can be greater than tp2. In one case, tp1 is 400 nm and plate 416 does not exist. The piezoelectric plate 412 and/or piezoelectric plate 416 may be a material as noted for plate 110. In some cases, they are the same material. in other cases, they are different materials. The bonding layer may be or include Al2O3 or SiO2.

Figure 4B:
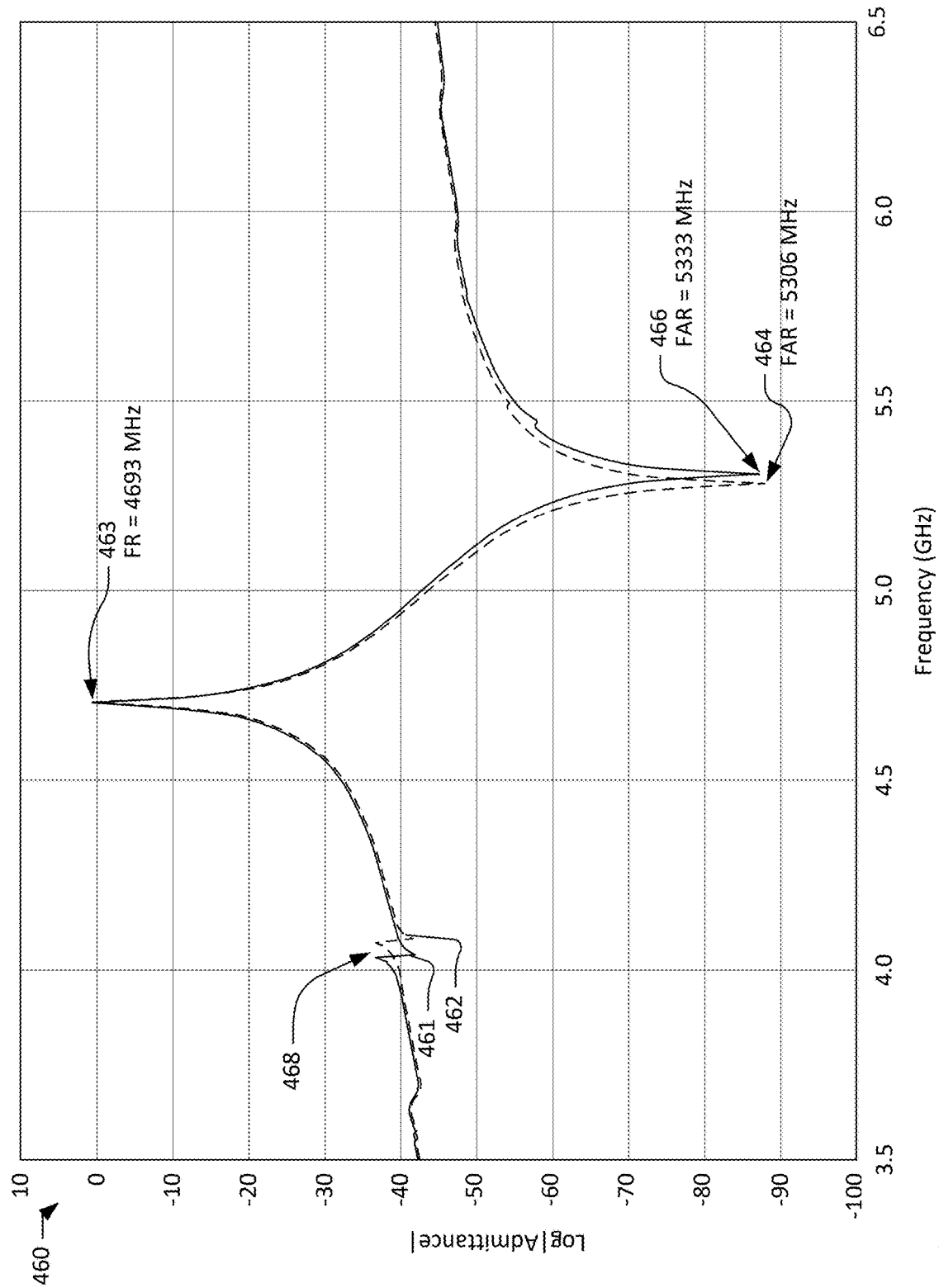
FIG. 4B is a graph that compares the admittances of XBARs with different membrane structures.

FIG. 4B is a graph 460 that compares the admittances of XBARs with different membrane structures. Graph 460 plots of the magnitudes of the admittances (on a logarithmic scale) as a function of frequency of the XBARs simulated using finite element method (FEM) simulation techniques. The admittance data results from three-dimensional simulation of XBARs with the following differences in parameters: a) plot 461 for a monolithic low frequency membrane where tp1 is 400 nm and there is no bonding layer or second piezoelectric plate; and b) plot 462 for a composite low frequency membrane where tp1 and tp2 are 197.5 nm, and tb is 10 nm.

For example, solid line plot 461 represents the admittance of an XBAR having a membrane that is a) a monolithic (single material) layer of a 400 nm thick plate; and the dashed line plot 462 represents the admittance of an XBAR having a membrane that is b) a composite (at least two material) layers of 197.5 nm thick top layer of lithium niobate that is chemically or molecularly bonded to a 10 nm thick Al2O3 bonding layer that is chemically or molecularly bonded to a 197.5 nm thick lower layer of lithium niobate. This simulation assumes the acoustic loss in the bonding layer in 100 times the acoustic loss in the lithium niobate.

Graph 460 shows that admittance performance is minimally affected by adding the bonding layer to the membrane in the composite layers b) as compared to the monolithic layer a). For example, resonator coupling (i.e., as shown by anti-resonance to resonance frequency difference) for the composite layers b) which is the distance between the frequency of anti-resonance at the lowest admittance peak (e.g., peak 463 at FR=4693 MHz) and the frequency of resonance at the highest admittance peak (e.g., peak 464 at FAR=5306 MHz) is reduced by only approximately 5% as compared to the resonator coupling for monolithic layer a) (e.g., peak 466 at FAR=5333 MHz).

Also, graph 460 also shows that some spurs, such as the spur at 468 is only slightly adjusted in frequency for composite layers b) as compared to monolithic layer a). The presence of the Al2O3 bonding layer does not noticeably affect device performance.

Figure 4C:
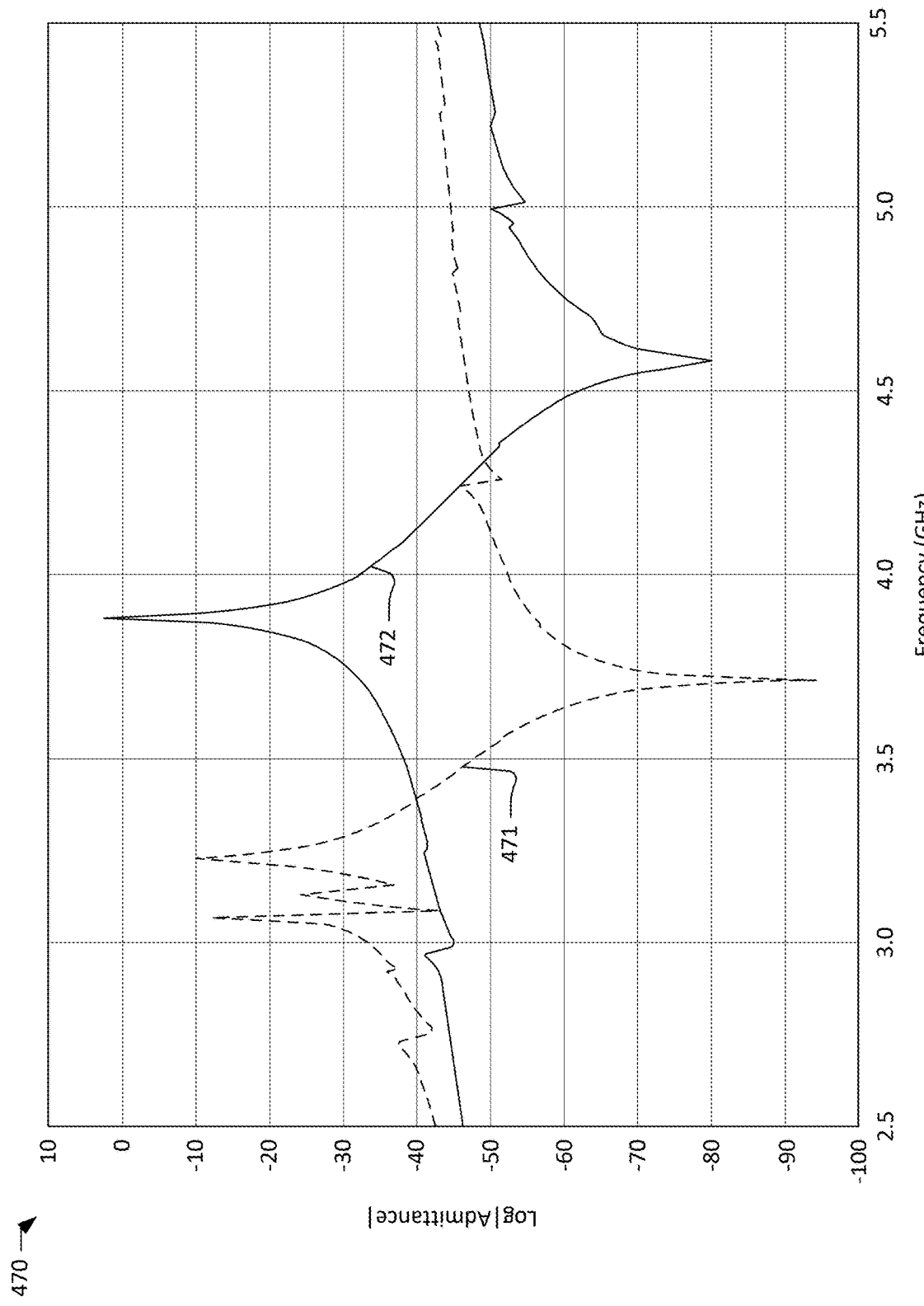
FIG. 4C is a graph that shows the admittances of improved XBAR shunt and series resonators formed on the same die with different membrane thicknesses.

FIG. 4C is a graph 470 that shows the admittances of improved XBAR shunt and series resonators formed on the same die with different membrane thicknesses. The resonators may be shunt resonator 402 and series resonator 404 of FIG. 4A. Graph 470 plots of the magnitudes of the admittances as a function of frequency of the XBARs simulated using FEM simulation techniques. The admittance data results from three-dimensional simulation of XBARs with tm=650 nm of aluminum for both.

The dashed plot line 471 is for an XBAR having a composite low frequency shunt membrane where plate 412 has tp1=465 nm of plate 110 material, plate 416 has tp2=120 nm of plate 110 material, and layer 414 has tb is 10 nm of Al2O3. The solid plot line 472 is for an XBAR having a composite high frequency series membrane where tp1=465 nm of plate 110 material, tb is 10 nm of Al2O3, and there is no second plate 416. Plate 416 may have been patterned and etched away from the high frequency membrane using bonding layer 414 as an etch stop. Layer 414 may be chemically or molecularly bonded to plate 412, and plate 416 (when present) may be chemically or molecularly bonded to layer 414.

Graph 470 shows that admittance performance is minimally affected by adding the bonding layer to the membrane in the composite layers of the series membrane as the metal resting on the Al2O3 bonding layer (e.g., the metal of the IDT fingers and the busbars) does not diminish device performance. The resonator Q factor and coupling is largely retained despite the added bonding layer between the LiNbO3 plates. Such shunt and series resonators on a single die could be used in a ladder configuration to create a spur-free n77 passband filter.

Figure 4D:
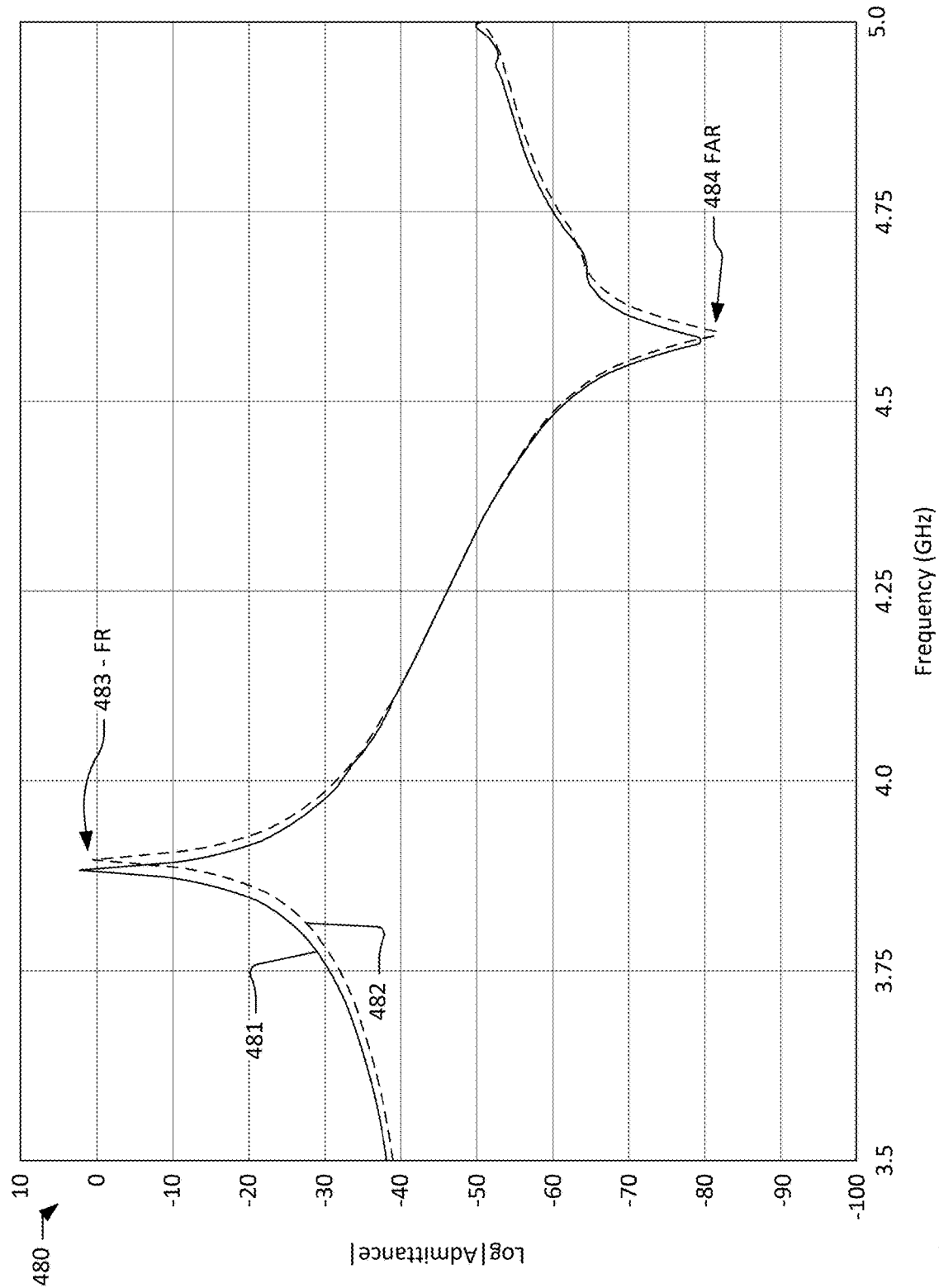
FIG. 4D is a graph that shows the admittances of improved XBAR series resonators formed on the same die with an improved XBAR shunt resonator having a different membrane thickness.

FIG. 4D is a graph 480 that shows the admittances of two improved XBAR series resonators having different bonding layer thickness formed on the same die with an improved XBAR shunt resonator having a different membrane thickness than the series resonators. The resonator may be series resonator 404 and the shunt resonator may be resonator 402 of FIG. 4A. Graph 480 plots of the magnitudes of the admittances as a function of frequency of the XBARs simulated using FEM simulation techniques. The admittance data results from three-dimensional simulation of XBARs with tm=650 nm of aluminum and there is no second plate 416.

The solid plot line 481 is for an XBAR membrane having: a) tb=10 nm of Al2O3 and tp1=465 nm of plate 110 material. The dashed plot line 482 is for an XBAR membrane having: b) tb=30 nm of Al2O3 and tp1=451 nm of plate 110 material. Plate 416 may have been patterned and etched away from these membranes using bonding layer 414 as an etch stop. Layer 414 may be chemically or molecularly bonded to plate 412.

Graph 480 shows that admittance performance is minimally affected by coupling the bonding layer to the membrane in the composite layers 412 and 414. For example, there is very little change (0.2 percent) between the two resonators with respect to their relative resonance anti-resonance frequency spacing (RAR) which is computed as:

$$RAR = \frac{f_a - f_R}{\frac{1}{2}(f_a + f_r)}$$

Graph 480 shows that the RAR's between relative resonance frequencies 483 and relative anti-resonance frequencies 484 of the two membranes to be: a) 16.5 percent and b) 16.3 percent. Maintaining this strong resonator coupling is important for the design of wide bandwidth filters, while also maintaining high-Q resonances which give low loss filter responses. Furthermore, the added bonding layer does not significantly introduce new spurious modes into the resonator, which is important for the design of good filters.

Figure 4E:
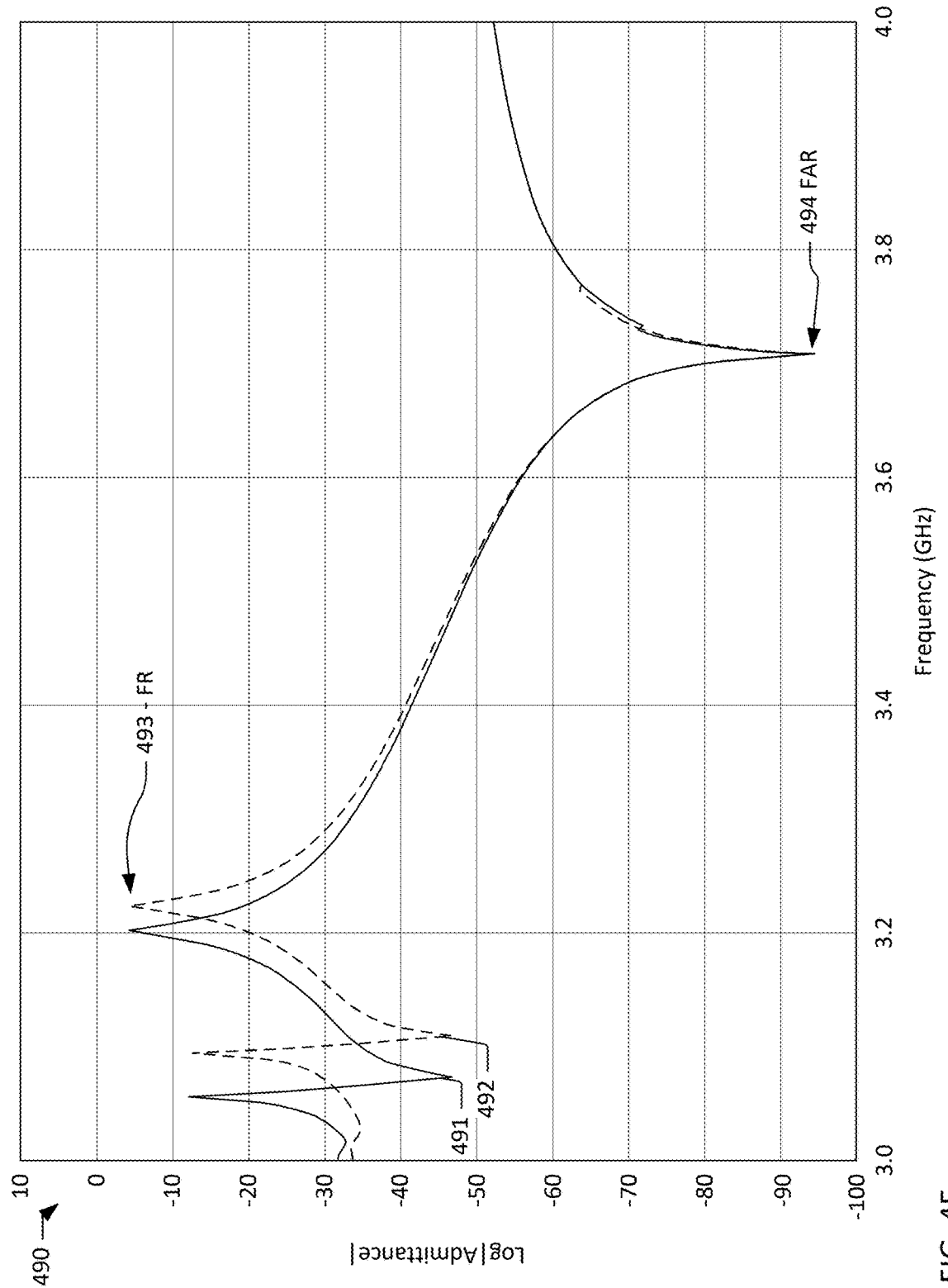
FIG. 4E is a graph that shows the admittances of improved XBAR shunt resonators formed on the same die with an improved XBAR series resonator having a different membrane thickness.

FIG. 4E is a graph 490 that shows the admittances of two improved XBAR shunt resonators having different bonding layer thickness formed on the same die with an improved XBAR series resonator having a different membrane thickness than the shunt resonators. The resonator may be shunt resonator 402 and the series resonator may be resonator 404 of FIG. 4A. Graph 490 plots of the magnitudes of the admittances as a function of frequency of the XBARs simulated using FEM simulation techniques. The admittance data results from three-dimensional simulation of XBARs with tm=650 nm of aluminum.

The solid plot line 491 is for an XBAR membrane having: a) tb=10 nm of Al2O3, tp2=120 nm of plate 110 material, and tp1=465 nm of plate 110 material. The dashed plot line 492 is for an XBAR membrane having: b) tb=30 nm of Al2O3, tp2=120 nm of plate 110 material, and tp1=450 nm of plate 110 material. Layer 414 may be chemically or molecularly bonded to plate 412, and plate 416 may be chemically or molecularly bonded to layer 414.

Graph 490 shows that admittance performance has some loss by coupling the thicker bonding layers to the membrane in the composite layers 412, 414 and 416. For example, there is some loss (0.7 percent) between the two resonators with respect to their RAR. Graph 490 shows that the RAR's between relative resonance frequencies 493 and relative anti-resonance frequencies 494 of the two membranes to be: a) 14.7 and b) 14.0 percent. Here again, maintaining this strong resonator coupling is important for the design of wide bandwidth filters, while also maintaining high-Q resonances which give low loss filter responses. Furthermore, the added bonding layer does not significantly introduce new spurious modes into this resonator, which is important for the design of good filters.

Figure 5:
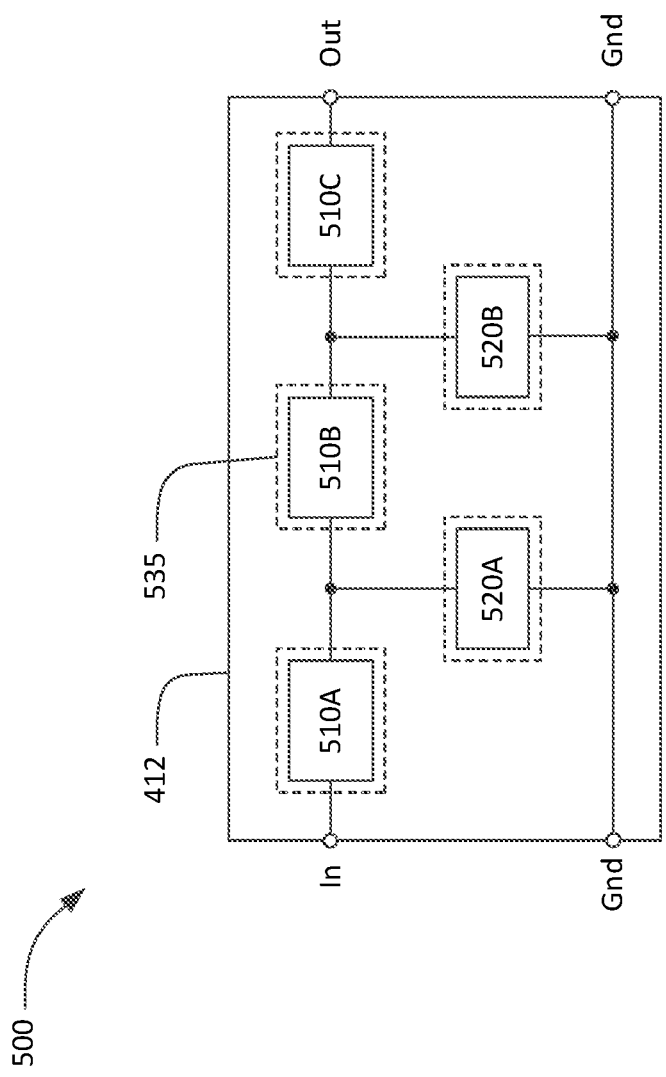
FIG. 5 is a schematic block diagram of a filter using XBARs.

FIG. 5 is a schematic circuit diagram and layout for a high frequency band-pass filter 500 using XBARs. The filter 500 has a conventional ladder filter architecture including three series resonators 510A, 510B, 510C and two shunt resonators 520A, 520B. The three series resonators 510A, 510B, and 510C are connected in series between a first port and a second port. In FIG. 5, the first and second ports are labeled "In" and "Out", respectively. However, the filter 500 is bidirectional and either port and serve as the input or output of the filter. The two shunt resonators 520A, 520B are connected from nodes between the series resonators to ground. All the shunt resonators and series resonators are XBARs on a single die.

The three series resonators 510A, B, C and the two shunt resonators 520A, B of the filter 500 are formed on a single plate 412 of piezoelectric material bonded to a silicon substrate (not visible). The series and shunt resonators all have bonding layer 414 formed on single plate 412 of piezoelectric material. The three series resonators 510A, B, C but not the two shunt resonators 520A, B have a single plate 416 of piezoelectric material bonded to the bonding layer 414. Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 5, the cavities are illustrated schematically as the dashed rectangles (such as the rectangle 535). In this example, each IDT is disposed over a respective cavity. In other filters, the IDTs of two or more resonators may be disposed over a single cavity.

Description of Methods

Figure 6:
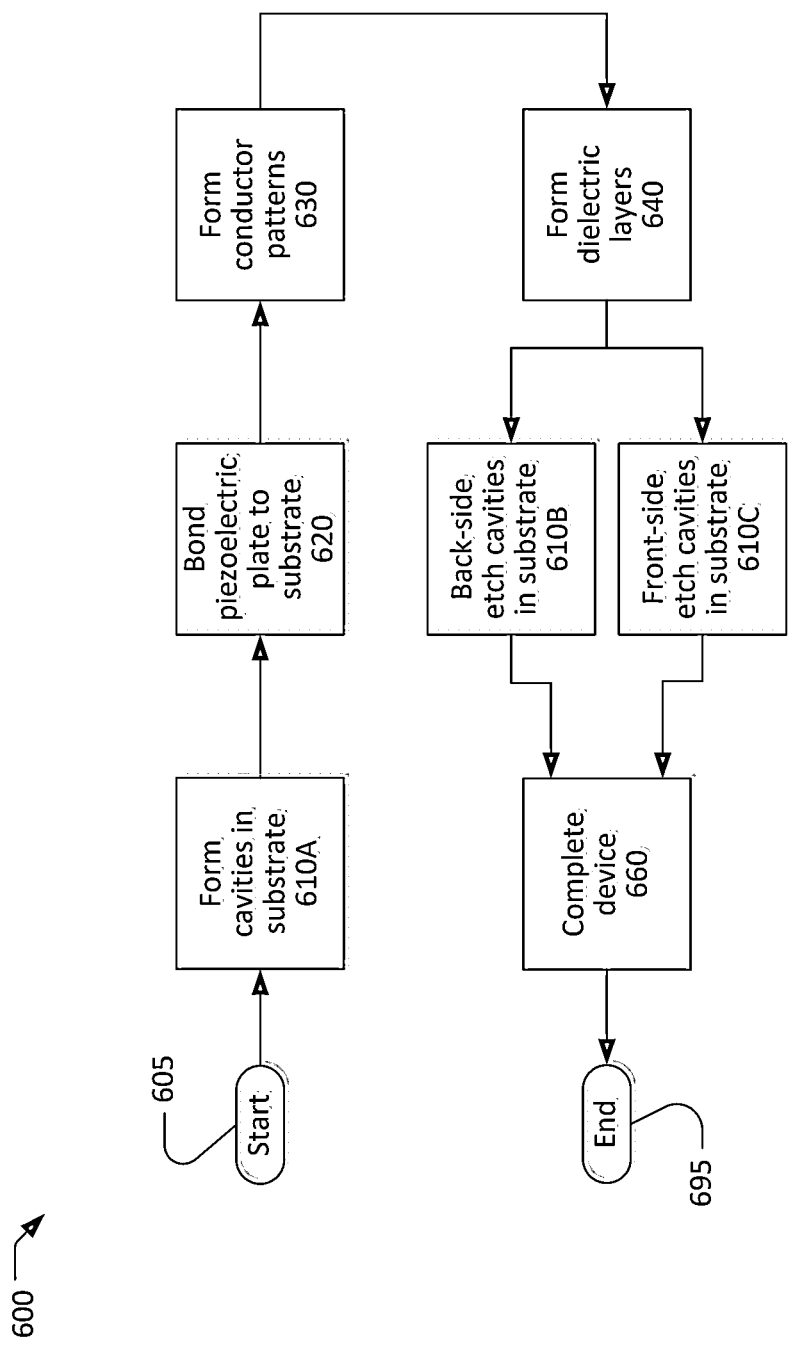
FIG. 6 is a flow chart of a process for fabricating an XBAR.

FIG. 6 is a simplified flow chart showing a process 600 for making an XBAR or a filter incorporating XBARs. The process 600 starts at 605 with a substrate and a plate of piezoelectric material which may be plate 412 and ends at 695 with a completed XBAR or filter. As will be described subsequently, the piezoelectric plate may be mounted on a sacrificial substrate or may be a portion of wafer of piezoelectric material. The flow chart of FIG. 6 includes only major process steps. Various conventional process steps (e.g. surface preparation, chemical mechanical processing (CMP), cleaning, inspection, deposition, photolithography, baking, annealing, monitoring, testing, etc.) may be performed before, between, after, and during the steps shown in FIG. 6.

The flow chart of FIG. 6 captures three variations of the process 600 for making an XBAR which differ in when and how cavities are formed in the substrate. The cavities may be formed at steps 610A, 610B, or 610C. Only one of these steps is performed in each of the three variations of the process 600.

The piezoelectric plate may be, for example, Z-cut, rotated Z-cut, or rotated Y-cut lithium niobate, lithium tantalate or a material noted for plate 110. The piezoelectric plate may be some other material and/or some other cut. The plate may be plate 412, membrane 410 and/or membrane 450. The substrate may be silicon. The substrate may be some other material that allows formation of deep cavities by etching or other processing. The silicon substrate may have layers of silicon TOX and polycrystalline silicon.

In one variation of the process 600, one or more cavities are formed in the substrate 120, 320, 420 at 610A, before the piezoelectric plate is bonded to the substrate at 620. A separate cavity may be formed for each resonator in a filter device. The one or more cavities may be formed using conventional photolithographic and etching techniques. These techniques may be isotropic or anisotropic; and may use deep reactive ion etching (DRIE). Typically, the cavities formed at 610A will not penetrate through the substrate or layer 320, 420, and the resulting resonator devices will have a cross-section as shown in FIG. 3A or 4A.

At 620, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

In a first variation of 620, the piezoelectric plate is initially mounted on a sacrificial substrate. After the piezoelectric plate and the substrate are bonded, the sacrificial substrate, and any intervening layers, are removed to expose the surface of the piezoelectric plate (the surface that previously faced the sacrificial substrate). The sacrificial substrate may be removed, for example, by material-dependent wet or dry etching or some other process.

In a second variation of 620 starts with a single-crystal piezoelectric wafer. Ions are implanted to a controlled depth beneath a surface of the piezoelectric wafer (not shown in FIG. 6). The portion of the wafer from the surface to the depth of the ion implantation is (or will become) the thin piezoelectric plate and the balance of the wafer is effectively the sacrificial substrate. After the implanted surface of the piezoelectric wafer and device substrate are bonded, the piezoelectric wafer may be split at the plane of the implanted ions (for example, using thermal shock), leaving a thin plate of piezoelectric material exposed and bonded to the substrate. The thickness of the thin plate piezoelectric material is determined by the energy (and thus depth) of the implanted ions. The process of ion implantation and subsequent separation of a thin plate is commonly referred to as "ion slicing". The exposed surface of the thin piezoelectric plate may be polished or planarized after the piezoelectric wafer is split.

The piezoelectric plate bonded to the substrate at 620 may be plate 412. Bonding the plate at 620 may include descriptions for forming membrane 410 and 450 at FIGS. 4A and/or 7A-C. The piezoelectric plate bonded to the substrate at 620 may be have two (or more) different XBAR piezoelectric membrane (e.g., diaphragm) thicknesses on the same die to tune the membranes, rather than by using a dielectric frequency setting layer on the membranes. The different thickness of these piezoelectric layers can be selected to cause selected XBARs to be tuned to different frequencies as compared to the other XBARs. For example, the resonance frequencies of the XBARs in a filter may be tuned using the different thickness of these piezoelectric layers.

Conductor patterns and dielectric layers defining one or more XBAR devices are formed on the surface of the piezoelectric plate at 630. Typically, a filter device will have two or more conductor layers that are sequentially deposited and patterned. The conductor layers may include bonding pads, gold or solder bumps, or other means for making connection between the device and external circuitry. The conductor layers may be, for example, aluminum, an aluminum alloy, copper, a copper alloy, molybdenum, tungsten, beryllium, gold, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layers and the piezoelectric plate. The conductor layers may include bonding pads, gold or solder bumps, or other means for making connection between the device and external circuitry.

Conductor patterns may be formed at 630 by depositing the conductor layers over the surface of the piezoelectric plate and removing excess metal by etching through patterned photoresist. Alternatively, the conductor patterns may be formed at 630 using a lift-off process. Photoresist may be deposited over the piezoelectric plate and patterned to define the conductor pattern. The conductor layer may be deposited in sequence over the surface of the piezoelectric plate. The photoresist may then be removed, which removes the excess material, leaving the conductor pattern. In some cases, forming at 630 occurs prior to bonding at 620, such as where the IDT's are formed prior to bonding the plate to the substrate.

Forming conductor patterns at 630 may include descriptions for forming membrane 410 and/or 450 at FIGS. 4A and/or 7A-C.

At 640, a front-side dielectric layer or layers may be formed by depositing one or more layers of dielectric material on the front side of the piezoelectric plate, over one or more desired conductor patterns of IDT or XBAR devices. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate. In some cases, depositing at 640 includes depositing a first thickness of at least one dielectric layer over the front-side surface of selected IDTs, but no dielectric or a second thickness less than the first thickness of at least one dielectric over the other IDTs. An alternative is where these dielectric layers are only between the interleaved fingers of the IDTs.

The one or more dielectric layers may include, for example, a dielectric layer selectively formed over the IDTs of shunt resonators to shift the resonance frequency of the shunt resonators relative to the resonance frequency of series resonators as described in U.S. Pat. No. 10,491,192. The one or more dielectric layers may include an encapsulation/passivation layer deposited over all or a substantial portion of the device.

The different thickness of these dielectric layers causes the selected XBARs to be tuned to different frequencies as compared to the other XBARs. For example, the resonance frequencies of the XBARs in a filter may be tuned using different front-side dielectric layer thickness on some XBARs. The different thicknesses of the piezoelectric plates noted at 620 can be used as a replacement for or in combination with having these different thickness dielectric layers to tune the XBARS. As compared to the admittance of an XBAR with tfd=0 (i.e. an XBAR without dielectric layers), the admittance of an XBAR with tfd=30 nm dielectric layer reduces the resonant frequency by about 145 MHz compared to the XBAR without dielectric layers. The admittance of an XBAR with tfd=60 nm dielectric layer reduces the resonant frequency by about 305 MHz compared to the XBAR without dielectric layers. The admittance of an XBAR with tfd=90 nm dielectric layer reduces the resonant frequency by about 475 MHz compared to the XBAR without dielectric layers. Importantly, the presence of the dielectric layers of various thicknesses has little or no effect on the piezoelectric coupling.

In a second variation of the process 600, one or more cavities are formed in the back side of the substrate at 610B after all the conductor patterns and dielectric layers are formed at 630. A separate cavity may be formed for each resonator in a filter device. The one or more cavities may be formed using an anisotropic or orientation-dependent dry or wet etch to open holes through the back-side of the substrate to the piezoelectric plate. In this case, the resulting resonator devices will have a cross-section as shown in FIG. 1.

In a third variation of the process 600, one or more cavities in the form of recesses in the substrate may be formed at 610C by etching a sacrificial layer formed in the front side of the substrate using an etchant introduced through openings in the piezoelectric plate. A separate cavity may be formed for each resonator in a filter device. The one or more cavities may be formed using an isotropic or orientation-independent dry etch that passes through holes in the piezoelectric plate and etches the recesses in the front-side of the substrate. The one or more cavities formed at 610C will not penetrate completely through the substrate, and the resulting resonator devices will have a cross-section as shown in FIG. 3A or 4A. For variations 610B and 610C, descriptions above regarding cavities are regarding locations for the cavities, prior to forming the cavities at 610B or 610C.

In all variations of the process 600, the filter or XBAR device is completed at 660. Actions that may occur at 660 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 660 is to tune the resonant frequencies of the resonators within a filter device by adding or removing metal or dielectric material from the front side of the device. After the filter device is completed, the process ends at 695. FIGS. 1-3G may show examples of the fingers of selected IDTs after completion at 660.

Forming the cavities at 610A may require the fewest total process steps but has the disadvantage that the XBAR diaphragms will be unsupported during all of the subsequent process steps. This may lead to damage to, or unacceptable distortion of, the diaphragms during subsequent processing.

Forming the cavities using a back-side etch at 610B requires additional handling inherent in two-sided wafer processing. Forming the cavities from the back side also greatly complicates packaging the XBAR devices since both the front side and the back side of the device must be sealed by the package.

Forming the cavities by etching from the front side at 610C does not require two-sided wafer processing and has the advantage that the XBAR diaphragms are supported during all of the preceding process steps. However, an etching process capable of forming the cavities through openings in the piezoelectric plate will necessarily be isotropic. However, as illustrated in FIG. 3D and FIG. 8, such an etching process using a sacrificial material allows for a controlled etching of the cavity, both laterally (i.e. parallel to the surface of the substrate) as well as normal to the surface of the substrate.

Figure 7A:
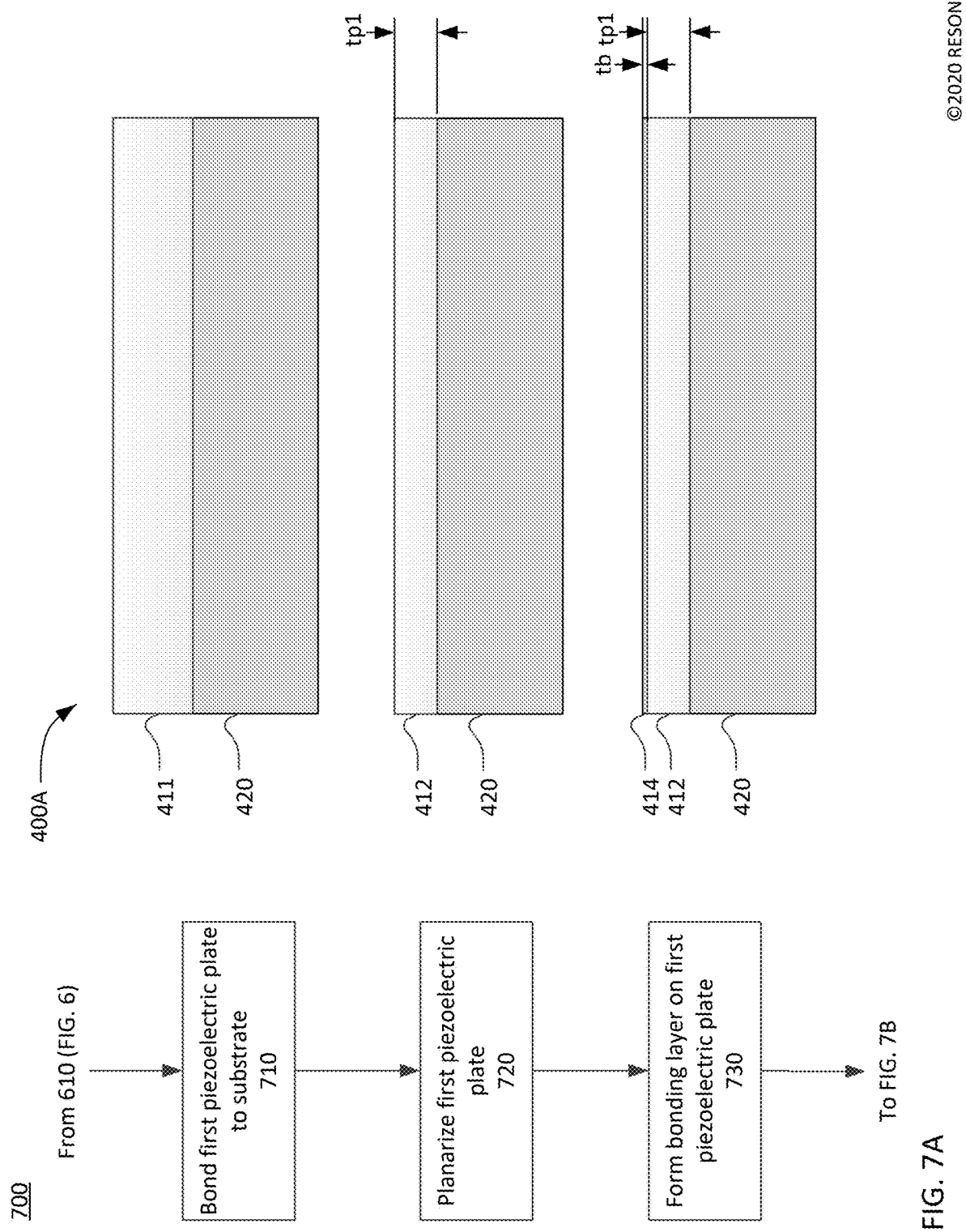
FIGS. 7A, 7B and 7C (collectively "FIG. 7") are a flow chart of another process for fabricating XBAR resonators on the same die with different membrane thicknesses.
Figure 7B:
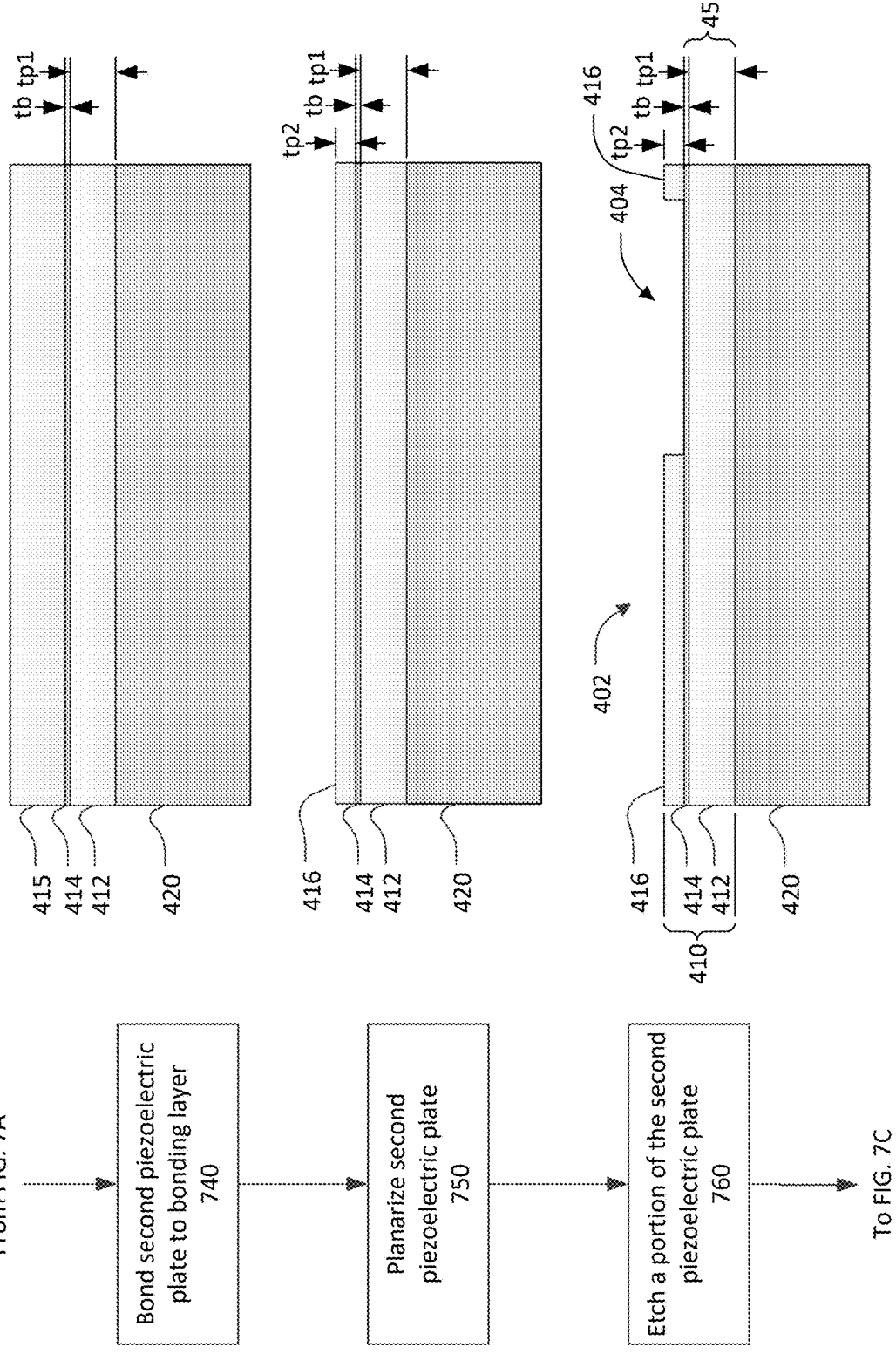
Figure 7C:
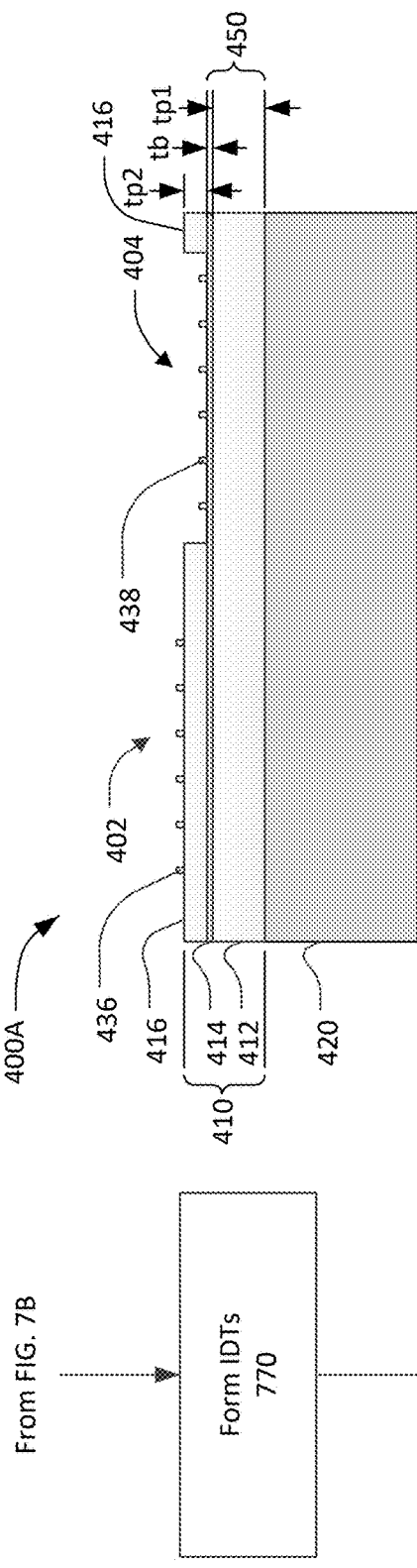

FIG. 7A, FIG. 7B, and FIG. 7C (collectively "FIG. 7") are a simplified flow chart of an improved process 700 for fabricating an XBAR with resonators 402 and 404 formed on the same die 400A with different membrane thicknesses, such as shown in FIG. 4A. Process 700 may describe fabricating two (or more) different XBAR piezoelectric membrane (e.g., diaphragm) thicknesses on the same die to tune the membranes. To the right of each action in the flow chart is a schematic cross-sectional view representing the end of each action. The process 700 starts at 710 in FIG. 7A with a substrate 420 and a first plate of piezoelectric material 411. The first piezoelectric plate may be mounted on a sacrificial substrate or may be a portion of wafer of piezoelectric material as previously described. The process 700 ends at 785 in FIG. 7C with a completed XBAR with resonators 402 and 404 formed on the same die. The flow chart of FIG. 7 includes only major process steps. Various conventional process steps (e.g. surface preparation, cleaning, inspection, deposition, photolithography, baking, annealing, monitoring, testing, etc.) may be performed before, between, after, and during the steps shown in FIG. 7.

At 710, first piezoelectric plate 411 is bonded to substrate 420. Bonding at 710 may be bonding a piezoelectric wafer to a silicon carrier wafer. This bonding may represent or be any of the processes for forming a piezoelectric plate noted at 620. First piezoelectric plate 411 and substrate 420 may be materials described for and bonded as noted for any of the plates and substrates as noted herein. Substrate 420 may include prior to bonding or be later etched to form cavities 440 and 444 (not shown in FIG. 7) as shown in FIG. 4A. Those cavities may be formed by any process noted at 610A, 610B or 610C.

At 720, first piezoelectric plate 411 is planarized to form piezoelectric plate 412 having thickness tp1. Planarizing at 720 may be accurately thinning the thickness of a piezoelectric wafer to for example, 465 nm or another thickness of tp1. At 720, the exposed surface of first piezoelectric plate 411 may be polished or planarized such as using chemical mechanical processing (CMP) from a thickness greater than thickness tp1 as shown at 710, down to thickness tp1 as shown at 720.

At 730, a bonding layer 414 is formed on the planarized surface of piezoelectric plate 412. Forming at 730 may be coating a piezoelectric plate interface with a thin bonding layer that is 2-5 nm thick and that can act as an etch stop layer for subsequent etching to a piezoelectric plate layer thickness definition. The bonding layer may be Al2O3 or SiO2. In some cases, it is any material suitable for molecular bonding to the plate 412 material and to the plate 416 material. Forming at 730 may include blanket depositing the bonding material over all of the exposed top surfaces of the plate using atomic layer deposition (ALD) to form the bonding layer. The bonding layer has thickness tb and is a material described for layer 414.

At 740, second piezoelectric plate 415 is bonded to bonding layer 414. Bonding at 740 may be bonding a piezoelectric wafer to a top surface of layer 412 using bonding layer 414. This bonding may represent or be any of the processes for forming a piezoelectric plate noted at 620. Second piezoelectric plate 415 may be a material as noted for any of the plates herein. The bonding of plate 415 to the bonding layer 414 may be as described for bonding any of the plates and bonding layers as noted herein. The second piezoelectric plate 415 layer may be bonded using a direct-bond process to the bonding layer 414.

The crystal-cut orientation of piezoelectric plates 412 and 415 may be different to so that they bond better, couple better and perform better as a dual-wafer (e.g., two piezoelectric plates bonded to together) stack than if they had the same orientation. The difference in crystal-cut orientation of piezoelectric plates 412 and 415 can be selected for a predetermined performance or tuning of shunt resonators which require thicker piezoelectric dual-wafer plate to operate at lower frequency than the series resonators.

At 750, second piezoelectric plate 415 is planarized to form piezoelectric plate 416 having thickness tp2. Planarizing at 750 may be accurately thinning the thickness of a piezoelectric wafer to a final thickness of for example, 120 nm or another thickness of tp2. At 750, the exposed surface of second piezoelectric plate 415 may be polished or planarized such as using chemical mechanical processing (CMP) from a thickness greater than thickness tp2 as shown at 740, down to thickness tp2 as shown at 740.

At 760, one or more portions of piezoelectric plate 416 are etched and removed to form membrane 450 where the plate is etched. Etching at 760 may be patterning a wafer having the substrate, and layers 412, 414 and 416 to expose areas at locations of the series resonators 404; then, selectively etching plate 416 from the top of the wafer to remove plate 416 from over the higher-frequency series membranes 450, while leaving plate 416 over the lower-frequency shunt membranes 410. Etching at 760 may be patterning and etching to: remove thickness tp2 of plate 416 at one or more areas above one or more cavities 444 to form membranes 450; and to leave thickness tp2 of plate 416 at one or more areas above one or more cavities 440 to form membranes 410. During the etch, layer 414 may function as an etch stop layer that prevents etching damage to plate 412 (and layer 414) during the etching of layer 416 in areas above the high-frequency series resonator membranes 450. Layer 414 may function as an etch stop layer in that it will be impervious to and/or etch magnitudes slower than the material of plate 416 by the processes and chemicals used to etch plate 416. This etching may represent or be any of the processes for removing portions of layer 416 to form membrane 450 as noted herein.

Forming the thinned membranes 450 may include forming a patterned mask layer over the plate 416 at areas where resonators 410 will be formed. The patterned mask may function like an etch stop in that it will be impervious to and/or etch magnitudes slower than the plate 416 by the processes and chemicals used to etch that plate. Suitable mask layers may include photoresist materials such as a light sensitive material, a light-sensitive organic material (e.g., a photopolymeric, photodecomposing, or photocrosslinking photoresist), or an an oxide or a nitride hard mask.

After the mask is patterned, the material of plate 416 is etched, and removed where it is not protected by the mask, thus forming the thinned membranes 450. The plate 416 can be etched, for example, by an anisotropic plasma etching, reactive ion etching, wet chemical etching, and/or other etching technique. Layer 414 may be impervious to or be etched magnitudes slower by the processes and chemicals used to etch plate 416. After this etch, the photoresist mask is removed from the top surface of plate 416 to leave the pattern of desired membranes 410. What remains on the wafer includes membranes 410 and 450 as shown.

At 770, IDTs are formed over portions of plate 416 and layer 414 where the shunt membranes 410 and series membranes 450 are formed, respectively. Forming the IDTs at 770 may create the shunt resonator 402 and series resonator 404 from their respective IDTs and membranes. During forming at 770, layer 414 may function as an etch stop layer that prevents etching damage to plate 412 (and layer 414) during the etching of IDT material from areas within perimeter 145 of the high-frequency series resonators. Forming IDTs at 770 may include descriptions for forming IDTs at 630 of FIG. 6.

Forming the IDTs at 770 may include etch-back processing which commences with blanket depositing IDT conductor material over the exposed top surfaces of plate 416 and layer 414. After this depositing, a patterned photoresist mask may be formed over the IDT conductor material at locations or areas where the IDTs will be formed. The photoresist mask may be blanket deposited over the IDT conductor material and then patterned using photolithography to define the conductor pattern at locations where the mask exists after patterning. The patterned photoresist mask may function like an etch stop in that it will be impervious to (and/or be etched magnitudes slower than the conductor material by) the processes and chemicals used to etch the conductor material. Suitable photoresist materials may include a light-sensitive organic material (e.g., a photopolymeric, photodecomposing, or photocrosslinking photoresist).

After the mask is patterned, the IDT conductor material is etched, such as by being dry etched, and removed where it is not protected by the photoresist mask, thus forming the IDT conductor patterns. The conductor layer can be etched, for example, by an anisotropic plasma etching, reactive ion etching, wet chemical etching, and other etching techniques. The etch etches or removes the conductor over and to the plate 416 over resonator 410 and layer 414 over resonator 450. Both, plate 416 and layer 414 may be impervious to (or be etched magnitudes slower by) the processes and chemicals used to etch the conductors. After this etch, the photoresist mask is removed from the top surface of the conductor material to leave the pattern of desired conductor material for the IDTs. The remaining desired conductor material include the IDT conductor and fingers 436 and 438. Process 700 may end at 770 with an XBAR with resonators 402 and 404 formed on the same die 400A with different membrane thicknesses to tune the membranes. In other cases, the process continues to 640 of FIG. 6 where dielectric layers are formed.

Using the bonding and etching process 700 enables XBAR resonators on the same die to have different membrane thicknesses that are accurately formed. This avoids difficulties in accurately fabricating desired membrane thicknesses; sensitivities of resonator frequency characteristics to the accuracy of the thickness of their membranes; and sensitivities of resonator characteristics to the acoustic and piezoelectric properties of their membranes. Process 700 solves these problems by providing means of accurately fabricating multiple membrane thicknesses on a die without significantly degrading resonator characteristics (e.g., resonant and anti-resonant frequencies and quality factor (Q), spurs, coupling, power handling, temperature coefficient of frequency (TCF)) or mechanical or thermal membrane characteristics.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, the pair of terms "top" and "bottom" can be interchanged with the pair "front" and "back". As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

The invention claimed is:

1. A filter device comprising:
a substrate having at least a first cavity and a second cavity on a single die;
a first piezoelectric plate spanning the first cavity and the second cavity;
a bonding layer spanning the first cavity and the second cavity; and
a second piezoelectric plate spanning the first cavity but not the second cavity;

a first interdigital transducer (IDT) on a front surface of the second piezoelectric plate over the first cavity; and a second IDT on a front surface of the bonding layer over the second cavity.

2. The device of claim 1, wherein a first resonator of an XBAR has the first piezoelectric plate, the bonding layer, the second piezoelectric plate and the first IDT over the first cavity; and a second resonator of the XBAR has the first piezoelectric plate, the bonding layer and the second IDT over the second cavity.

3. The device of claim 2, wherein the first and the second resonators are configured such that a radio frequency signal applied to the first and second IDTs excite different first and second primary shear acoustic modes in the first and second resonators.

4. The device of claim 3, wherein a thickness of the first piezoelectric plate and a thickness of the second piezoelectric plate are selected to tune the first and the second shear primary acoustic waves.

5. The device of claim 1, wherein the bonding layer is one of Al2O3 or SiO2.

6. The device of claim 1, wherein the bonding layer is an etch stop for etching the second piezoelectric plate.

7. The device of claim 1, wherein
the second piezoelectric plate is a first material capable of being etched by a first process; and
the bonding layer is a second material that is substantially impervious to the first process.

8. The device of claim 1, wherein the first and second piezoelectric plates are both either lithium niobate or lithium tantalate.

9. The device of claim 1, further comprising one or more openings through the piezoelectric plates and bonding layer.

10. The device of claim 1, wherein the first piezoelectric plate and the second piezoelectric plate have different thicknesses.

11. An acoustic resonator comprising:
a back surface of a first piezoelectric plate bonded to a top surface of a substrate having at least a first cavity and a second cavity;
a planarized top surface of the first piezoelectric plate forming a first thickness of the first piezoelectric plate;
the first piezoelectric plate spanning the first cavity and the second cavity;
a bonding layer bonded on a top surface of the first piezoelectric plate;
the bonding layer spanning the first cavity and the second cavity;
a back surface of a second piezoelectric plate bonded to a top surface of the bonding layer;
the second piezoelectric plate spanning the first cavity; and
a planarized top surface of the second piezoelectric plate forming a second thickness of the second piezoelectric plate;
wherein the second thickness is less than the first thickness.

12. The resonator of claim 11, wherein a first membrane has the first piezoelectric plate, the bonding layer, and the second piezoelectric plate over the first cavity; and a second membrane has the first piezoelectric plate and the bonding layer over the second cavity; and further comprising:

a first interdigital transducer (IDT) on a front surface of the first piezoelectric plate of the first membrane such that interleaved fingers of the first IDT are disposed over the first cavity;

a second IDT on a front surface of the second piezoelectric plate of the second membrane such that interleaved fingers of the second IDT are disposed over the second cavity.

13. The resonator of claim 12, wherein the first and second membranes and the first and second IDTs are configured such that a radio frequency signal applied to the first and second IDTs excite different first and second primary shear acoustic modes in first and second membranes of the first piezoelectric plate.

14. The resonator of claim 11, wherein the bonding layer is one of Al2O3 or SiO2.

15. The resonator of claim 11, wherein the bonding layer is an etch stop for the etching the second plate.

16. The resonator of claim 11, wherein the first piezoelectric plate and the second piezoelectric plate have different thicknesses.

17. The resonator of claim 11, wherein
the second piezoelectric plate is a first material capable of being etched by a first process; and
the bonding layer is a second material that is substantially impervious to the first process.

18. The resonator of claim 11, wherein the first and second piezoelectric plates are both either lithium niobate or lithium tantalate.

19. The resonator of claim 11, further comprising one or more openings through the piezoelectric plates and bonding layer for etching the first and second cavities through the opening.

20. A filter system comprising:
a substrate wafer having at least a first cavity and a second cavity on a single die;
a first piezoelectric plate wafer spanning the first cavity and the second cavity;
a bonding layer spanning the first piezoelectric plate wafer;
a second piezoelectric plate wafer spanning the first cavity but not the second cavity,
a first interdigital transducer (IDT) on a front surface of the first piezoelectric plate wafer over the first cavity; and
a second IDT on a front surface of the bonding layer over the second cavity;
wherein the first piezoelectric plate wafer and the second piezoelectric plate wafer have different thicknesses.

21. The system of claim 20, wherein a first resonator of the substrate wafer has the first piezoelectric plate wafer, the bonding layer, the second piezoelectric plate wafer and the first IDT over the first cavity; and a second resonator of the substrate wafer has the first piezoelectric plate wafer, the bonding layer and the second IDT over the second cavity.

22. The system of claim 21, wherein the first and the second resonators are configured such that a radio frequency signal applied to the first and second IDTs excite different first and second primary shear acoustic modes in the first and second resonators.

23. The device of claim 22, wherein the thickness of the first piezoelectric plate wafer and the thickness of the second piezoelectric plate wafer are selected to tune the first and the second shear primary acoustic modes.

* * * * *